(12) United States Patent
Liu et al.

(10) Patent No.: US 12,406,961 B2
(45) Date of Patent: Sep. 2, 2025

(54) INTEGRATED CIRCUIT PACKAGE AND METHOD

(71) Applicant: Taiwan Semiconductor Manufacturing Co., Ltd., Hsinchu (TW)

(72) Inventors: Chung-Shi Liu, Hsinchu (TW); Mao-Yen Chang, Kaohsiung (TW); Yu-Chia Lai, Zhunan Township (TW); Kuo-Lung Pan, Hsinchu (TW); Hao-Yi Tsai, Hsinchu (TW); Ching-Hua Hsieh, Hsinchu (TW); Hsiu-Jen Lin, Zhubei (TW); Po-Yuan Teng, Hsinchu (TW); Cheng-Chieh Wu, Hsinchu (TW); Jen-Chun Liao, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 391 days.

(21) Appl. No.: 18/150,240

(22) Filed: Jan. 5, 2023

(65) Prior Publication Data

US 2024/0113071 A1   Apr. 4, 2024

Related U.S. Application Data

(60) Provisional application No. 63/377,972, filed on Sep. 30, 2022.

(51) Int. Cl.
*H01L 23/00* (2006.01)
*H01L 21/56* (2006.01)
(Continued)

(52) U.S. Cl.
CPC ............ *H01L 24/95* (2013.01); *H01L 21/563* (2013.01); *H01L 23/3185* (2013.01);
(Continued)

(58) Field of Classification Search
CPC ... H01L 24/95; H01L 21/563; H01L 23/3185; H01L 23/4012; H01L 24/16; H01L 24/19;
(Continued)

(56) References Cited

U.S. PATENT DOCUMENTS 9,000,584 B2   4/2015  Lin et al.
9,048,222 B2   6/2015  Hung et al.
(Continued)

FOREIGN PATENT DOCUMENTS

TW   202101621 A   1/2021
TW   202218091 A   5/2022

*Primary Examiner* — Shahed Ahmed
(74) *Attorney, Agent, or Firm* — Slater Matsil, LLP

(57) ABSTRACT

An integrated circuit package including electrically floating metal lines and a method of forming are provided. The integrated circuit package may include integrated circuit dies, an encapsulant around the integrated circuit dies, a redistribution structure on the encapsulant, a first electrically floating metal line disposed on the redistribution structure, a first electrical component connected to the redistribution structure, and an underfill between the first electrical component and the redistribution structure. A first opening in the underfill may expose a top surface of the first electrically floating metal line.

20 Claims, 22 Drawing Sheets

(51) Int. Cl.
*H01L 23/31* (2006.01)
*H01L 23/40* (2006.01)
*H01L 25/18* (2023.01)
*H10B 80/00* (2023.01)

(52) U.S. Cl.
CPC .......... *H01L 23/4012* (2013.01); *H01L 24/16* (2013.01); *H01L 24/19* (2013.01); *H01L 24/20* (2013.01); *H01L 24/32* (2013.01); *H01L 24/73* (2013.01); *H01L 24/83* (2013.01); *H01L 25/18* (2013.01); *H10B 80/00* (2023.02); *H01L 2023/4081* (2013.01); *H01L 2023/4087* (2013.01); *H01L 2224/16227* (2013.01); *H01L 2224/19* (2013.01); *H01L 2224/211* (2013.01); *H01L 2224/215* (2013.01); *H01L 2224/32225* (2013.01); *H01L 2224/73204* (2013.01); *H01L 2224/83007* (2013.01); *H01L 2224/83939* (2013.01); *H01L 2224/95* (2013.01); *H01L 2924/01013* (2013.01); *H01L 2924/01022* (2013.01); *H01L 2924/01029* (2013.01); *H01L 2924/01074* (2013.01); *H01L 2924/3512* (2013.01)

(58) Field of Classification Search
CPC ........... H01L 24/83; H01L 2224/16227; H01L 2224/83939; H01L 25/50; H01L 23/4006; H01L 2224/023–024; H01L 2224/8385–83885; H01L 2224/83–83986; H01L 23/3157; H10B 80/00
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2019/0164783 A1* | 5/2019 | Huang .................... H01L 24/20 |
| 2020/0395257 A1 | 12/2020 | Chun et al. |
| 2021/0111156 A1* | 4/2021 | Elsherbini ............... H01L 24/17 |
| 2022/0020656 A1 | 1/2022 | Jung et al. |
| 2022/0139816 A1 | 5/2022 | Liao et al. |
| 2023/0178444 A1* | 6/2023 | Chang ................. H01L 23/3128 257/773 |
| 2024/0094460 A1* | 3/2024 | Lin ....................... G02B 6/1228 |

\* cited by examiner

INTEGRATED CIRCUIT PACKAGE AND METHOD

PRIORITY

This application claims the benefit of U.S. Provisional Application No. 63/377,972, filed on Sep. 30, 2022, entitled "Integrated Circuit Package and Method," which application is hereby incorporated by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
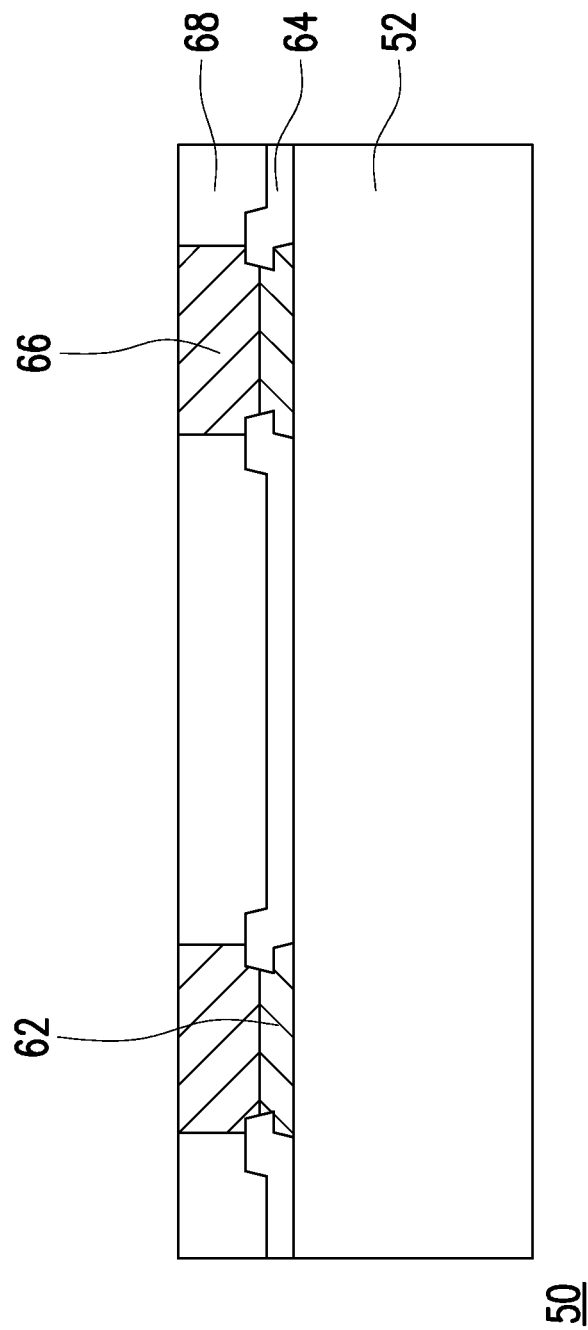
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit package is formed by clamping a package component between a thermal module and a mechanical brace. The package component includes a redistribution structure, electrically floating metal lines on the redistribution structure, and an underfill on the electrically floating metal lines. Openings are formed in the underfill that partially expose the electrically floating metal lines, which act as stop layers during the formation of the openings by laser sawing. The openings release stress in the underfill caused by warpage of the package component during manufacturing or operation, thereby reducing the risk of the underfill cracking. As a result, the reliability of the integrated circuit package is improved.

FIG. 1 illustrates a cross-sectional view of an integrated circuit die 50. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.), capacitors, resistors, etc. An interconnect structure (not separately illustrated) is over the semiconductor substrate 52, and interconnects the devices to form an integrated circuit. The interconnect structure may be formed of, for example, metallization patterns in dielectric layers on the semiconductor substrate 52. The metallization patterns include metal lines and vias formed in one or more low-k dielectric layers. The metallization patterns may be formed by a damascene process, such as a single damascene process, a dual damascene process, or the like. The metallization patterns of the interconnect structure are electrically coupled to the devices of the semiconductor substrate 52.

The integrated circuit die 50 further includes pads 62, such as aluminum pads, to which external connections are made. The pads 62 are on the active side of the integrated circuit die 50, such as in and/or on the interconnect structure. One or more passivation films 64 are on the integrated circuit die 50, such as on portions of the interconnect structure and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the top surface of the dielectric layer 68 is above the top surfaces of the die connectors 66. In some embodiments where solder regions are disposed on the die connectors 66, the dielectric layer 68 may also bury the solder regions. Alternatively, the solder regions may be removed prior to forming the dielectric layer 68.

The dielectric layer 68 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) device, a high bandwidth memory (HBM) device, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure.

FIGS. 2A through 11C illustrate various views of intermediate steps during a process for forming an integrated circuit package, in accordance with some embodiments. FIGS. 2A, 6A, 8A, 9A, 10A, and 11A are top-down views. FIGS. 2B, 3, 4, 5, 6B, 7, 8B, 9B, 10B, and 11B are cross-sectional views shown along respective reference cross-sections B-B' in the top-down views. FIGS. 8C, 9C, 10C, and 11C are cross-sectional views shown along respective reference cross-sections C-C' in the top-down views. A package component 100 (shown in FIGS. 10A-10C) is formed by packaging multiple integrated circuit dies 50. The package component 100 has multiple package regions, with one or more integrated circuit dies 50 being packaged in each of the package regions. The package regions may include computing sites 101 and connecting sites 102. Each of the computing sites 101 may have logic functions, memory functions, or the like, and the package component 100 may be a single computing device comprising the computing sites 101 and connecting sites 102, such as a system-on-wafer (SoW) device. For example, the package component 100 may be an artificial intelligence (AI) accelerator, and each computing site 101 may be a neural network node for the AI accelerator. Each of the connecting sites 102 may include external connectors, and the computing sites 101 of the package component 100 may connect to external systems through the connecting sites 102. Example systems for the package component 100 include AI systems, high-performance computing (HPC) systems, high power computing devices, cloud computing systems, edge computing systems, and the like. A certain layout and quantity of the computing sites 101 and the connecting sites 102 is illustrated, but it should be appreciated that the package component 100 may include any desired quantity of computing sites 101 and connecting sites 102, and the sites may be laid out in any desired layout. Subsequently, the package component 100 is secured between a thermal module 200 and a mechanical brace 300 (shown in FIGS. 11A-11C).

Figure 2A:
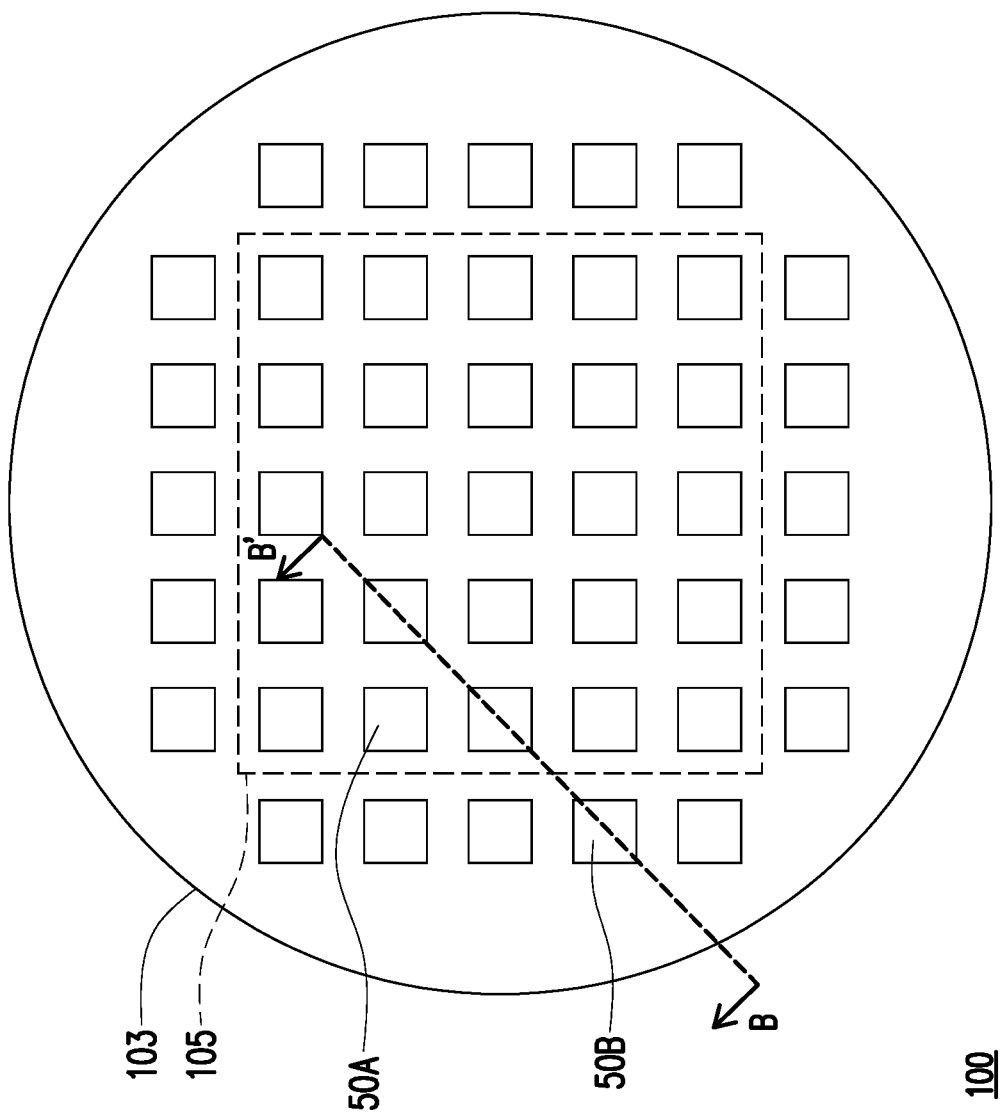
FIGS. 2A, 2B, 3, 4, 5, 6A, 6B, 7, 8A, 8B, 8C, 9A, 9B, 9C, 10A, 10B, 10C, 10D, 11A, 11B, and 11C illustrate various views of intermediate steps during a process for forming an integrated circuit package, in accordance with some embodiments.
Figure 2B:
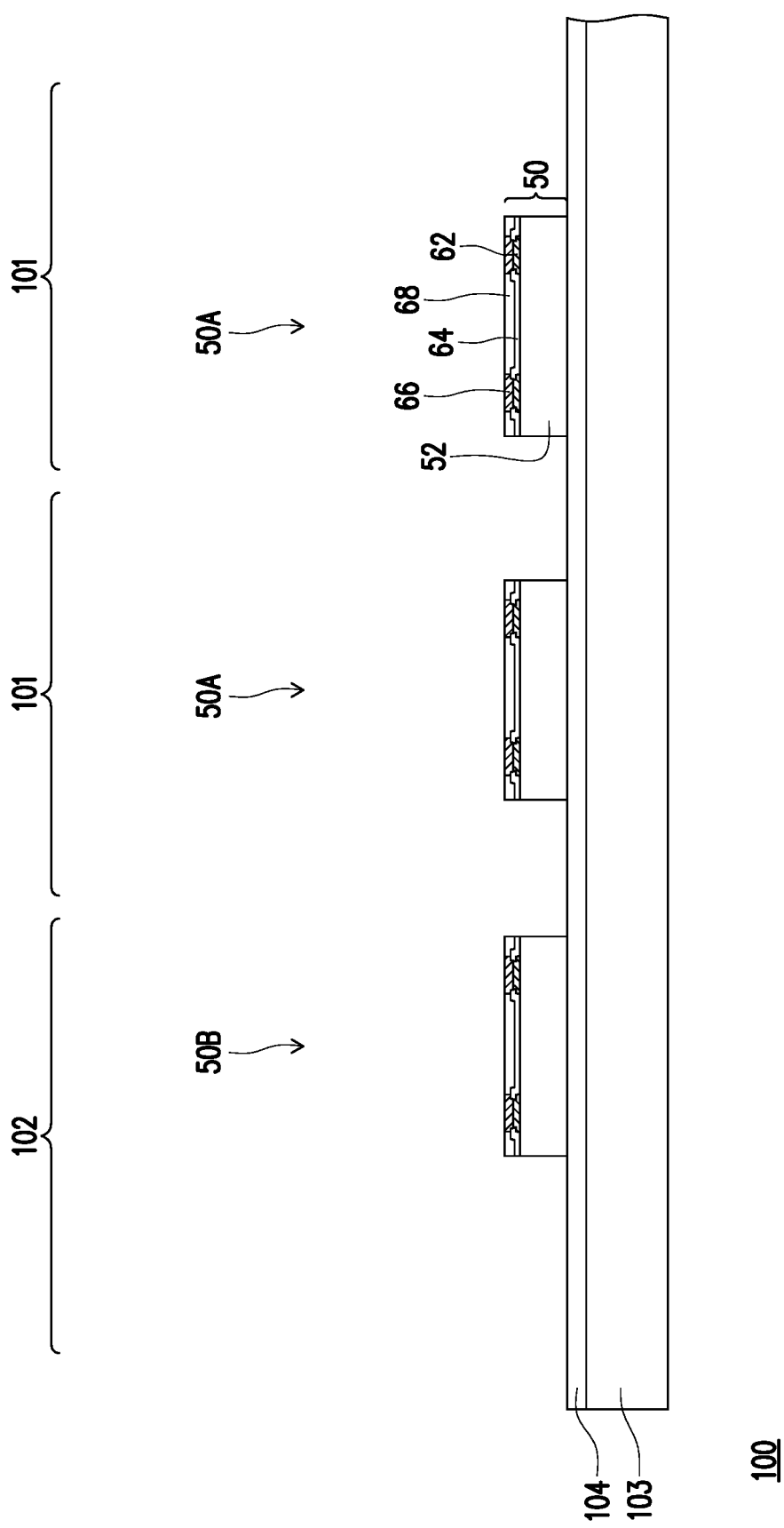

In FIGS. 2A-2B, a carrier substrate 103 is provided, and an adhesive layer 104 is formed on the carrier substrate 103. The carrier substrate 103 may be a glass carrier substrate, a ceramic carrier substrate, or the like. The carrier substrate 103 may be a wafer, such that multiple packages can be formed on the carrier substrate 103 simultaneously. The adhesive layer 104 may be removed along with the carrier substrate 103 from the overlying structures that will be formed in subsequent steps. In some embodiments, the adhesive layer 104 is any suitable adhesive, epoxy, die attach film (DAF), light-to-heat-conversion (LTHC) material, the like, or a combination thereof, and is applied over the surface of the carrier substrate 103.

Integrated circuit dies 50 are then attached to the adhesive layer 104. A desired type and quantity of integrated circuit dies 50 are attached in each of the computing sites 101 and the connecting sites 102. In some embodiments, a first type of integrated circuit die, such as a SoC die 50A, is attached in each computing site 101, and a second type of integrated circuit die, such as an I/O interface die 50B, is attached in each connecting site 102. As shown in FIG. 2A, SoC dies 50A may be disposed inside a center region 105 of the carrier substrate 103 and I/O interface dies 50B may be disposed outside the center region 105 of the carrier substrate 103. Although a single integrated circuit die 50 is illustrated in each site, it should be appreciated that multiple integrated circuit dies may be attached in one site at some or all of the sites. When multiple integrated circuit dies are attached in each computing site 101, they may be of the same technology node, or different technology nodes. For example, the integrated circuit dies 50 may include dies formed at a 10 nm technology node, dies formed at a 7 nm technology node, the like, or combinations thereof.

Figure 3:
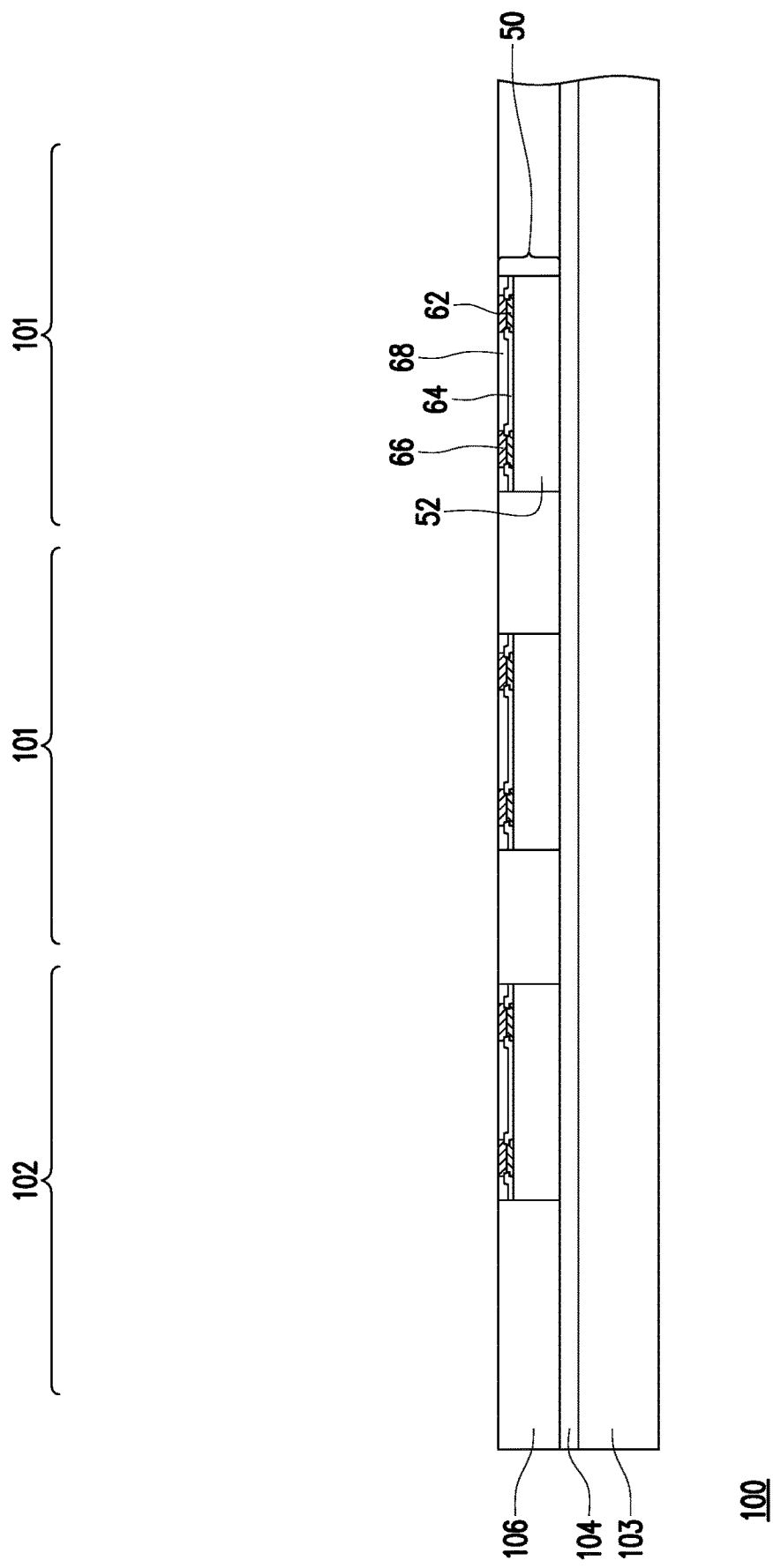

In FIG. 3, an encapsulant 106 is formed on and around the various components. After formation, the encapsulant 106 encapsulates the integrated circuit dies 50. The encapsulant 106 may be a molding compound, epoxy, or the like, and may be applied by compression molding, transfer molding, or the like. The encapsulant 106 may be applied in liquid or semi-liquid form and then subsequently cured. In some embodiments, the encapsulant 106 is formed over the carrier substrate 103 such that the integrated circuit dies 50 are buried or covered, and a removal process is then performed on the encapsulant 106 to expose the die connectors 66 of the integrated circuit dies 50. The removal process may include a planarization process, such as a chemical-mechanical polish (CMP), an etch-back, combinations therefore, or the like. Top surfaces of the encapsulant 106, the die connectors 66, and the dielectric layers 68 may be coplanar (within process variations) after the planarization process.

In FIGS. 4-6B, a redistribution structure 108 having a fine-featured portion 108A and a coarse-featured portion 108B (shown in FIG. 6B) is formed over the encapsulant 106 and the integrated circuit dies 50. Additionally, metal lines 135 are formed on the redistribution structure 108. The redistribution structure 108 includes metallization patterns, dielectric layers, and under-bump metallurgies (UBMs). The metallization patterns may also be referred to as redistribution layers or redistribution lines. The redistribution structure 108 is shown as an example having six layers of metallization patterns. More or fewer dielectric layers and metallization patterns may be formed in the redistribution structure 108. If fewer dielectric layers and metallization patterns are to be formed, steps and process discussed below may be omitted. If more dielectric layers and metallization patterns are to be formed, steps and processes discussed below may be repeated. The fine-featured portion 108A and the coarse-featured portion 108B of the redistribution structure 108 include metallization patterns and dielectric layers of differing sizes.

Figure 4:
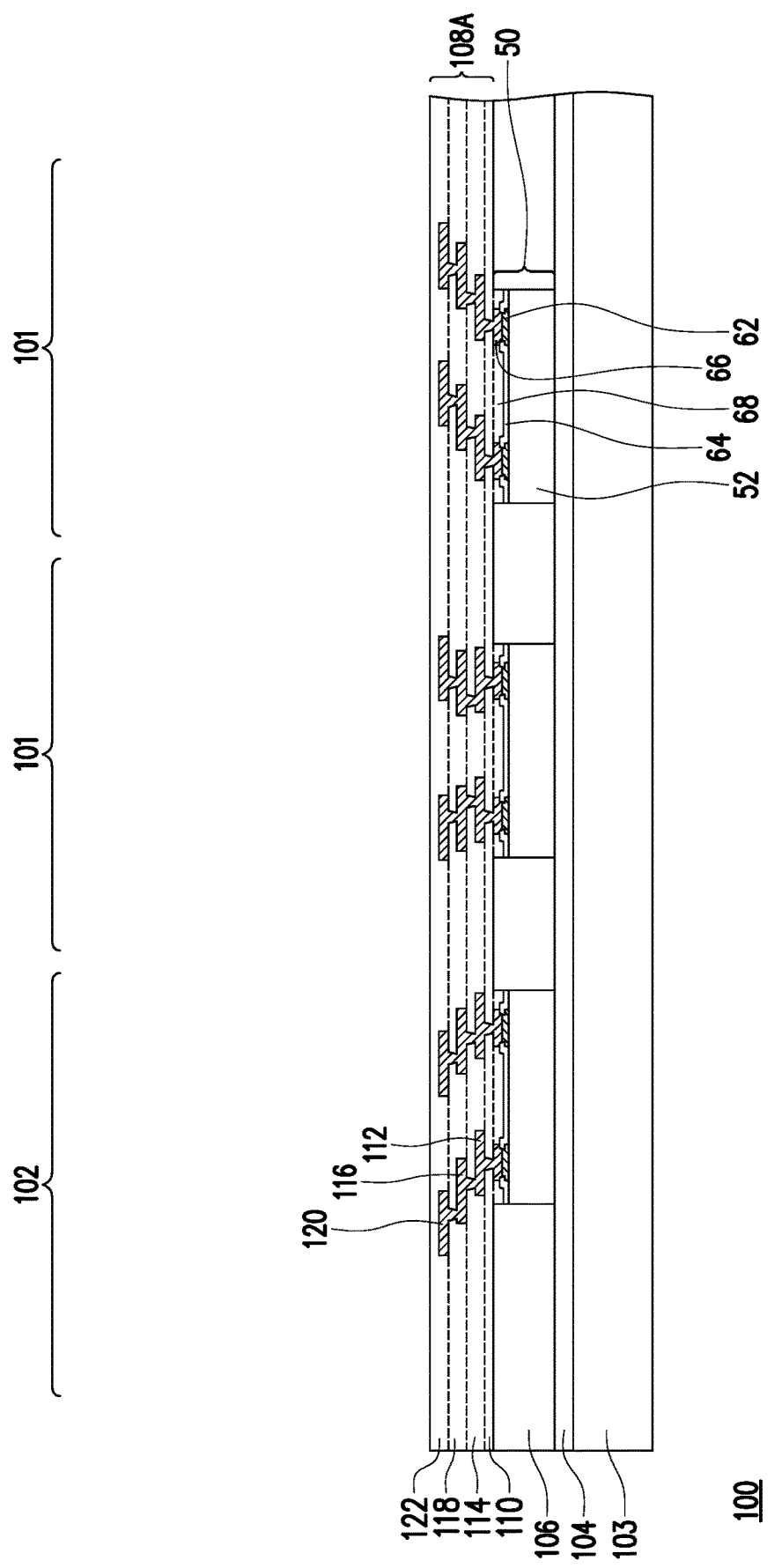

In FIG. 4, the fine-featured portion 108A of the redistribution structure 108 is formed. The fine-featured portion 108A of the redistribution structure 108 includes dielectric layers 110, 114, 118, and 122; and metallization patterns 112, 116, and 120. In some embodiments, the dielectric layers 114, 118 and 122 are formed of a same dielectric material, and are formed to various thicknesses. In some embodiments, the conductive features of the metallization patterns 112, 116 and 120 are formed of a same conductive material, and are formed to various thicknesses. The thicknesses of the dielectric layers 114, 118 and 122 may be in a range from 5 µm to 7.5 µm, and the thicknesses of the conductive features of the metallization patterns 112, 116 and 120 may be in a range from 4 µm to 7 µm.

As an example of forming the fine-featured portion 108A of the redistribution structure 108, the dielectric layer 110 is deposited on the encapsulant 106, the dielectric layers 68, and the die connectors 66. In some embodiments, the dielectric layer 110 is formed of a photo-sensitive material such as PBO, polyimide, BCB, or the like, which may be patterned using a lithography mask. The dielectric layer 110 may be formed by spin coating, lamination, CVD, the like, or a combination thereof. The dielectric layer 110 is then patterned. The patterning forms openings exposing portions of the die connectors 66. The patterning may be by an acceptable process, such as by exposing the dielectric layer 110 to light when the dielectric layer 110 is a photo-sensitive material or by etching using, for example, an anisotropic etch when the dielectric layer 110 is a photo-insensitive material. If the dielectric layer 110 is a photo-sensitive material, the dielectric layer 110 can be developed after the exposure.

The metallization pattern 112 is then formed. The metallization pattern 112 has line portions (also referred to as conductive lines or traces) on and extending along the major surface of the dielectric layer 110, and has via portions (also referred to as conductive vias) extending through the dielectric layer 110 to physically and electrically couple the die connectors 66 of the integrated circuit dies 50. As an example to form the metallization pattern 112, a seed layer is formed over the dielectric layer 110 and in the openings extending through the dielectric layer 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the conductive material and the seed layer form the metallization pattern 112.

The dielectric layer 114 is then deposited on the metallization pattern 112 and dielectric layer 110. The dielectric layer 114 may be formed in a similar manner and of a similar material as the dielectric layer 110. The metallization pattern 116 is then formed. The metallization pattern 116 has line portions on and extending along the major surface of the dielectric layer 114, and has via portions extending through the dielectric layer 114 to physically and electrically couple the metallization pattern 112. The metallization pattern 116 may be formed in a similar manner and of a similar material as the metallization pattern 112.

The dielectric layer 118 is then deposited on the metallization pattern 116 and dielectric layer 114. The dielectric layer 118 may be formed in a similar manner and of a similar material as the dielectric layer 110. The metallization pattern 120 is then formed. The metallization pattern 120 has line portions on and extending along the major surface of the dielectric layer 118, and has via portions extending through the dielectric layer 118 to physically and electrically couple the metallization pattern 116. The metallization pattern 120 may be formed in a similar manner and of a similar material as the metallization pattern 112.

The dielectric layer 122 is deposited on the metallization pattern 120 and dielectric layer 118. The dielectric layer 122 may be formed in a similar manner and of a similar material as the dielectric layer 110.

Figure 5:
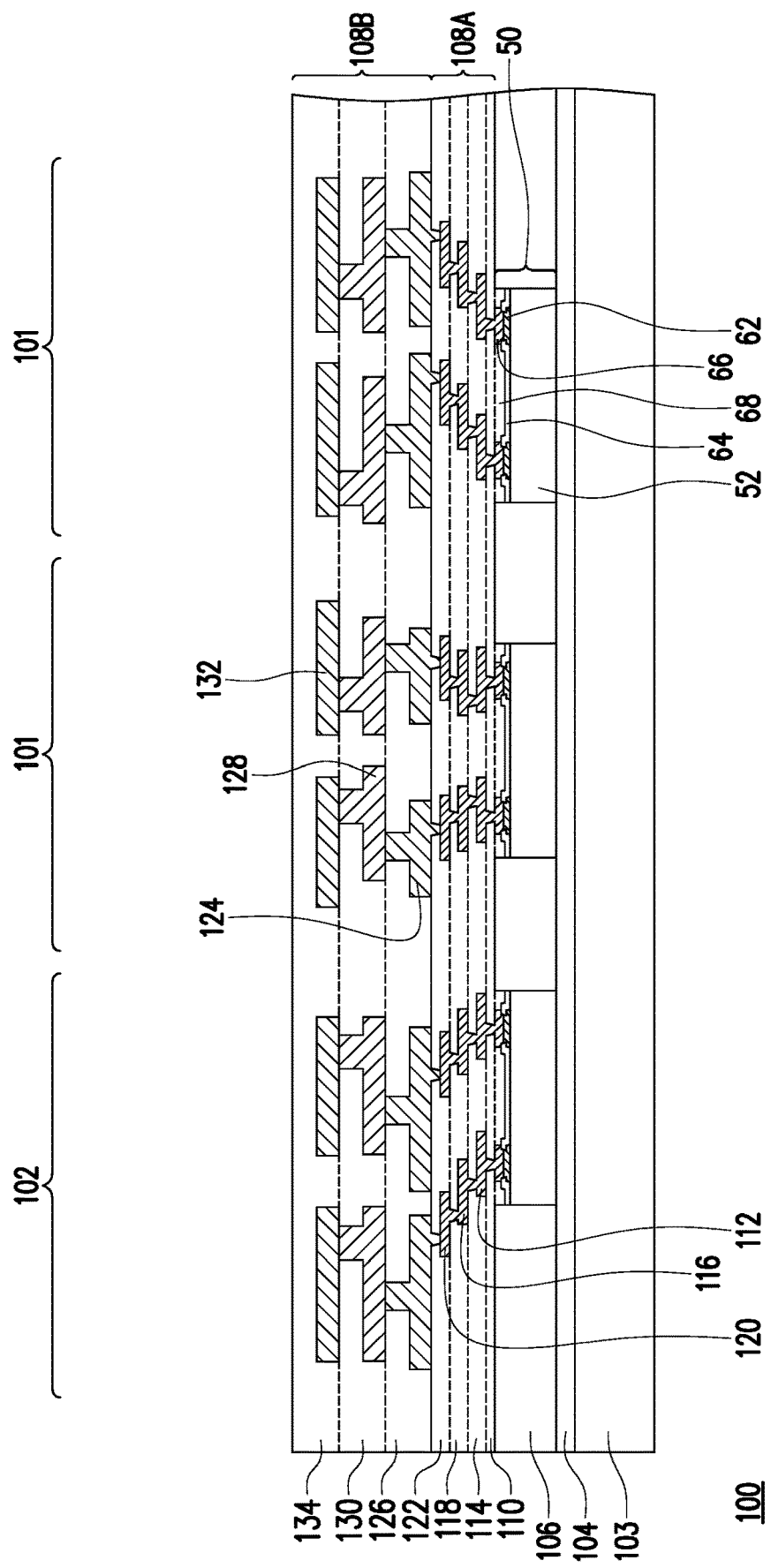

In FIG. 5, the coarse-featured portion 108B of the redistribution structure 108 is formed. The coarse-featured portion 108B of the redistribution structure 108 includes dielectric layers 126, 130, and 134; and metallization patterns 124, 128, and 132. In some embodiments, the dielectric layers 126, 130, and 134 are formed of various dielectric materials, and are formed to various thicknesses. In some embodiments, the conductive features of the metallization patterns 124, 128, and 132 are formed of a same conductive material, and are formed to various thicknesses. The thicknesses of the dielectric layers 126, 130, and 134 may be in a range from 20 µm to 25 µm, and the thicknesses of the conductive features of the metallization patterns 124, 128, and 132 may be in a range from 10 µm to 15 µm. In some embodiments, thicknesses of the dielectric layers 126, 130, and 134 may be greater than the thicknesses of the dielectric layers 114, 118 and 122 (shown in FIG. 4), and thicknesses of the metallization patterns 124, 128, and 132 may be greater than the thicknesses of the metallization patterns 112, 116 and 120 (shown in FIG. 4).

As an example of forming the coarse-featured portion 108B of the redistribution structure 108, the dielectric layer 122 is patterned. The patterning forms openings exposing portions of the metallization pattern 120. The patterning may be by an acceptable process, such as by exposing the dielectric layer 122 to light when the dielectric layer 122 is a photo-sensitive material or by etching using, for example, an anisotropic etch when the dielectric layer 122 is a photo-insensitive material. If the dielectric layer 122 is a photo-sensitive material, the dielectric layer 122 can be developed after the exposure.

The metallization pattern 124 is then formed. The metallization pattern 124 has line portions on and extending along the major surface of the dielectric layer 122, lower via portions extending through the dielectric layer 122 to physically and electrically couple the metallization pattern 120, and upper via portions on the line portions. As an example to form the metallization pattern 124, a seed layer is formed over the dielectric layer 122 and in the openings extending through the dielectric layer 122. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A first photoresist is then formed and patterned on the seed layer. The first photoresist may be formed by spin coating or the like and may be exposed to light for patterning. The pattern of the first photoresist corresponds to the line portions and the lower via portions of the metallization pattern 124. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. A second photoresist is then formed and patterned on the line portions of the metallization pattern 124. The second photoresist may be formed by spin coating or the like and may be exposed to light for patterning. The pattern of the second photoresist corresponds to the upper via portions of the metallization pattern 124. The patterning forms openings through the second photoresist to expose the line portions of the metallization pattern 124. Additional conductive material is then formed in the openings of the second photoresist and on the exposed portions of the line portions of the metallization pattern 124. The additional conductive material may be formed by plating from the line portions of the metallization pattern 124, without forming a seed layer on line portions of the metallization pattern 124. The second photoresist and portions of the seed layer on which the conductive material is not formed are removed. The second photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the conductive material and the seed layer form the metallization pattern 124.

The dielectric layer 126 is then formed around the metallization pattern 124 and on the dielectric layer 122. In some embodiments, the dielectric layer 126 is formed of a photo-insensitive material such as a photo-insensitive molding compound, which includes a photo-insensitive resin having fillers disposed therein. Examples of photo-insensitive resins include epoxy, acrylic, or polyimide-based materials. Examples of fillers include silica or the like. The dielectric layer 126 may be formed by compression molding, transfer molding, or the like, and may be applied in liquid or semi-liquid form and then subsequently cured. The metallization pattern 128 is then formed. The metallization pattern 128 has line portions on and extending along the major surface of the dielectric layer 126, which are physically and electrically coupled to the metallization pattern 124, and has via portions on the line portions. The metallization pattern 128 may be formed in a similar manner and of a similar material as the line and upper via portions of the metallization pattern 124.

The dielectric layer 130 is then formed around the metallization pattern 128 and on the dielectric layer 126. The dielectric layer 130 may be formed in a similar manner and of a similar material as the dielectric layer 126. The metallization pattern 132 is then formed. The metallization pattern 132 has line portions on and extending along the major surface of the dielectric layer 130, which are physically and electrically coupled to the metallization pattern 128. The metallization pattern 132 may be formed in a similar manner and of a similar material as the line portions of the metallization pattern 124.

The dielectric layer 134 is deposited on the metallization pattern 132 and dielectric layer 130. The dielectric layer 134 may be formed in a similar manner and of a similar material as the dielectric layer 110. Accordingly, the dielectric layers 110, 114, 118, 122, and 134 may be formed of a first dielectric material, and the dielectric layers 126 and 130 may be formed of a second dielectric material, where the first dielectric material is different from the second dielectric material.

Figure 6A:
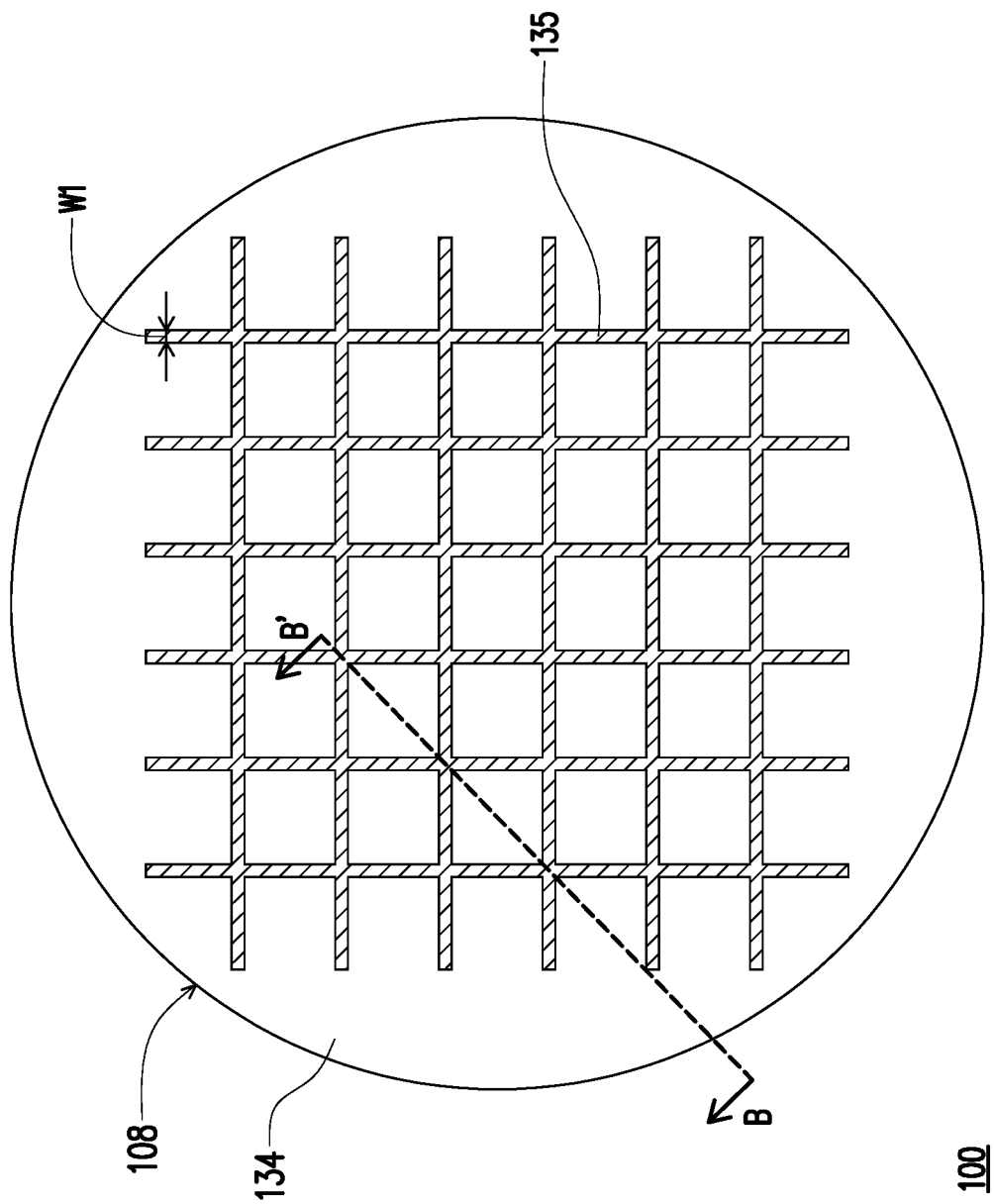
Figure 6B:
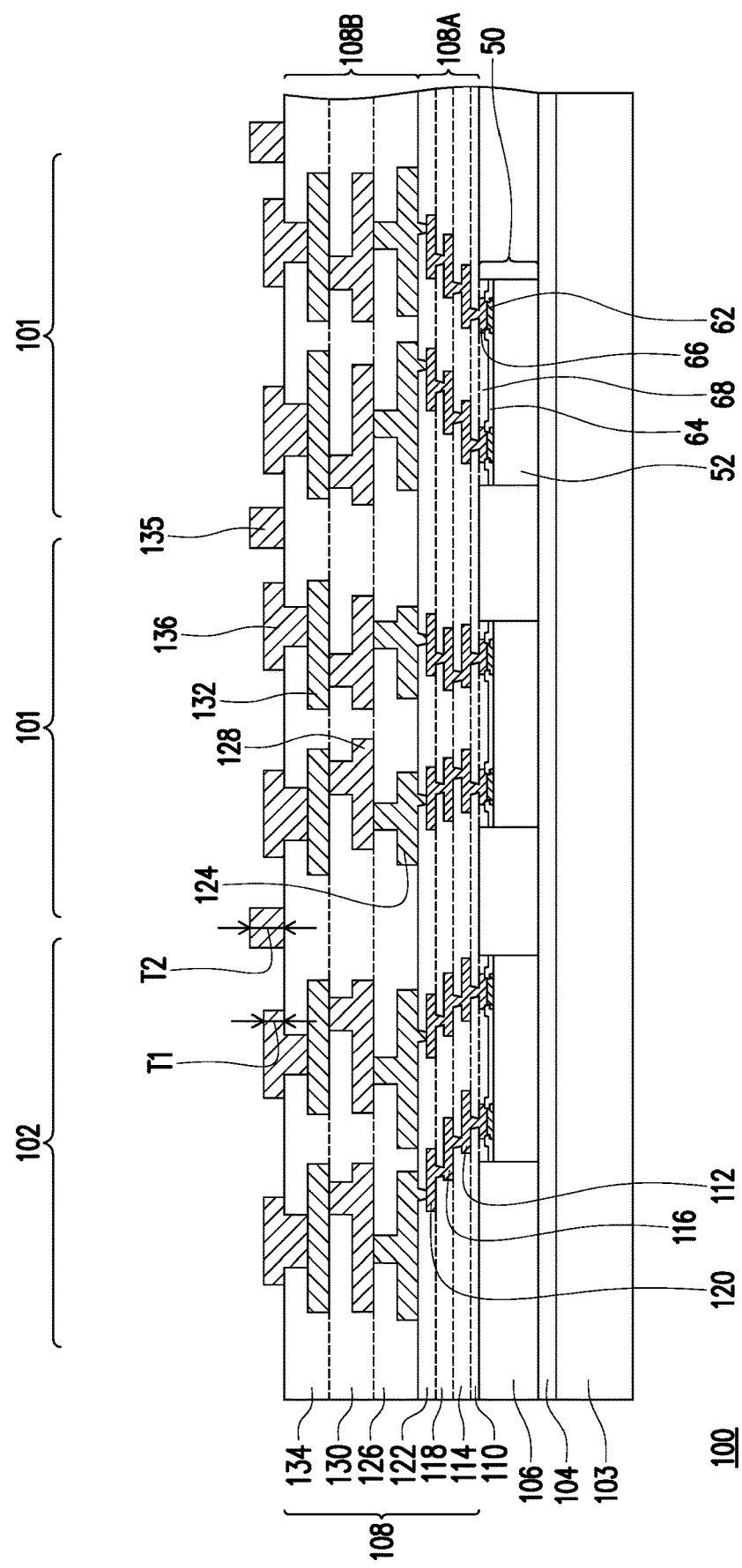

In FIGS. 6A through 6B, UBMs 136 (also referred to as metal pads) are formed for external connection to the redistribution structure 108. Additionally, metal lines 135 are formed on the redistribution structure 108, such as on the dielectric layer 134. The metal lines 135 may be electrically floating, such that they are electrically isolated from and not coupled to the integrated circuit dies 50. The metal lines 135 are spaced apart from and not coupled to the UBMs 136. As described in greater detail below, the metal lines 135 will be used as stop layers during a subsequent laser sawing process, thereby reducing the risk of damage to the redistribution structure 108.

As shown in FIG. 6B, the UBMs 136 have bump portions on and extending along the major surface of the dielectric layer 134, and have via portions extending through the dielectric layer 134 to physically and electrically couple the metallization pattern 132. As a result, the UBMs 136 are electrically coupled to the integrated circuit dies 50. The bump portions of the UBMs 136 may have a thickness T1 in a range from 7 µm to 12 µm, such as 12 µm.

As shown in FIG. 6A, a first subset of the metal lines 135 extend in a first (e.g., horizontal) direction along the major surface of the dielectric layer 134, and a second subset of the metal lines 135 extend in a second (e.g., vertical) direction along the major surface of the dielectric layer 134. Each of the first subset of the metal lines 135 may be parallel with the other metal lines 135 in the first subset. Each of the second subset of the metal lines 135 may be parallel with the other metal lines 135 in the second subset. The first direction may be perpendicular to the second direction. The horizontal metal lines 135 may intersect with the vertical metal lines 135 to form a metal grid on the redistribution structure 108. The metal lines 135 may be electrically floating or electrically isolated from the conductive features of the redistribution structure 108, such as the UBMs 136 and the metallization patterns 112, 116, 120, 124, 128, and 132 (not shown in FIG. 6A for illustrative purposes; but see FIG. 6B). As shown in FIG. 6B, each metal line 135 may be disposed between two neighboring UBMs 136 and may be separated from the two neighboring UBMs 136. The metal lines 135 may be separated from the metallization pattern 132 by the dielectric layer 134. The metal lines 135 may have a width W1 in a range from 0.5 mm to 0.7 mm, such as 0.6 mm. The metal lines 135 may have a thickness T2 in a range from 8 µm to 15 µm, such as 15 µm. In some embodiments, the thickness T2 of the metal lines 135 may be larger than the thickness T1 of the bump portions of the UBMs 136. As a result, a top surface of the dielectric layer 134 may be spaced apart from top surfaces of the metal lines 135 by a larger distance than top surfaces of the bump portions of the UBMs 136.

The UBMs 136 and the metal lines 135 may (or may not) be formed in a same process, such as a same plating process. Accordingly, the UBMs 136 and the metal lines 135 may (or may not) be formed of the same conductive material. As an example to form the UBMs 136 and the metal lines 135, the dielectric layer 134 is patterned. The patterning forms openings exposing portions of the metallization pattern 132. The patterning may be by an acceptable process, such as by exposing the dielectric layer 134 to light when the dielectric layer 134 is a photo-sensitive material or by etching using, for example, an anisotropic etch when the dielectric layer 134 is a photo-insensitive material. If the dielectric layer 134 is a photo-sensitive material, the dielectric layer 134 can be developed after the exposure. A seed layer is formed over the dielectric layer 134 and in the openings extending through the dielectric layer 134. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 136 and the metal lines 135. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the conductive material and the seed layer form the UBMs 136 and the metal lines 135. The UBMs 136 are in the openings extending through the dielectric layer 134. The metal lines 135 are above the dielectric layer 134 and do not extend through the dielectric layer 134. Other acceptable process(es) may be utilized to form the UBMs 136 and the metal lines 135. For example, the metal lines 135 may be plated separately before or after the plating of the UBMs 136, by using similar plating processes as previously described.

As previously described, the thickness T2 of the metal lines 135 may be larger than the thickness T1 of the bump portions of the UBMs 136. The thicknesses T1 and T2 may be different as be a result of different plating rates during the plating process, such as due to different densities of the patterns of the metal lines 135 and the UBMs 136. The pattern of the metal lines 135 may have a lower density than the pattern of the UBMs 136, such that the conductive material of the metal lines 135 may be plated at a faster rate than the conductive material of the UBMs 136.

Figure 7:
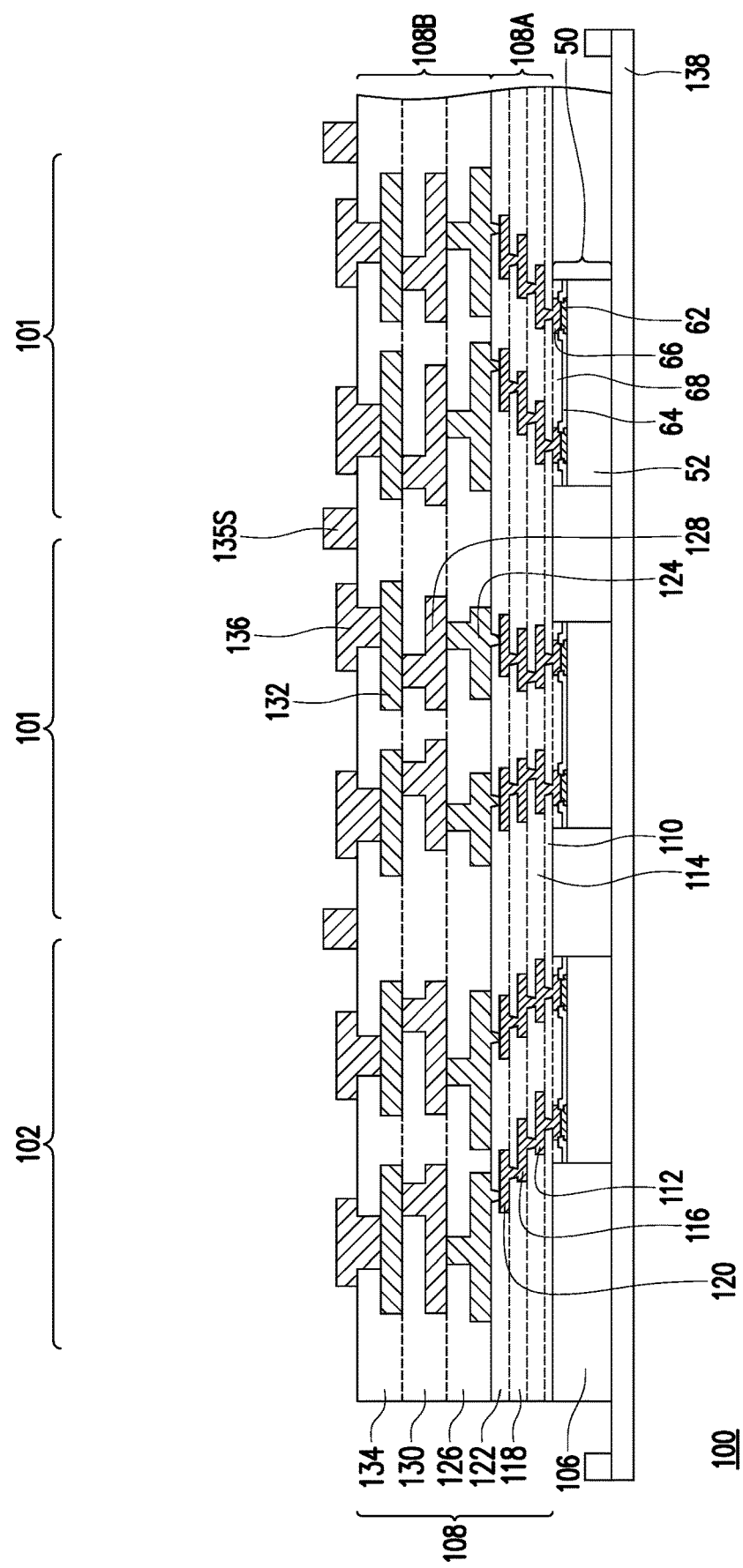

In FIG. 7, a carrier substrate debonding is performed to debond (or detach) the carrier substrate 103 from the encapsulant 106 and the integrated circuit dies 50. In some embodiments, the debonding process may include projecting a light beam, such as a laser beam, on the adhesive layer 104. As a result of the light exposure, the adhesive layer 104 may be decomposed, and the carrier substrate 103 may be lifted off. A plasma cleaning may be performed to clean any reside of the adhesive layer 104 from the integrated circuit dies 50 and the encapsulant 106 after the debonding process. In some embodiments, the debonding process may include removing the carrier substrate 103 and the adhesive layer 104 by, e.g., a grinding or planarization process. After removal, back side surfaces of the integrated circuit dies 50 may be exposed, and the back side surfaces of the encapsulant 106 and integrated circuit dies 50 may be level. The structure is then placed on a tape 138.

Figure 8A:
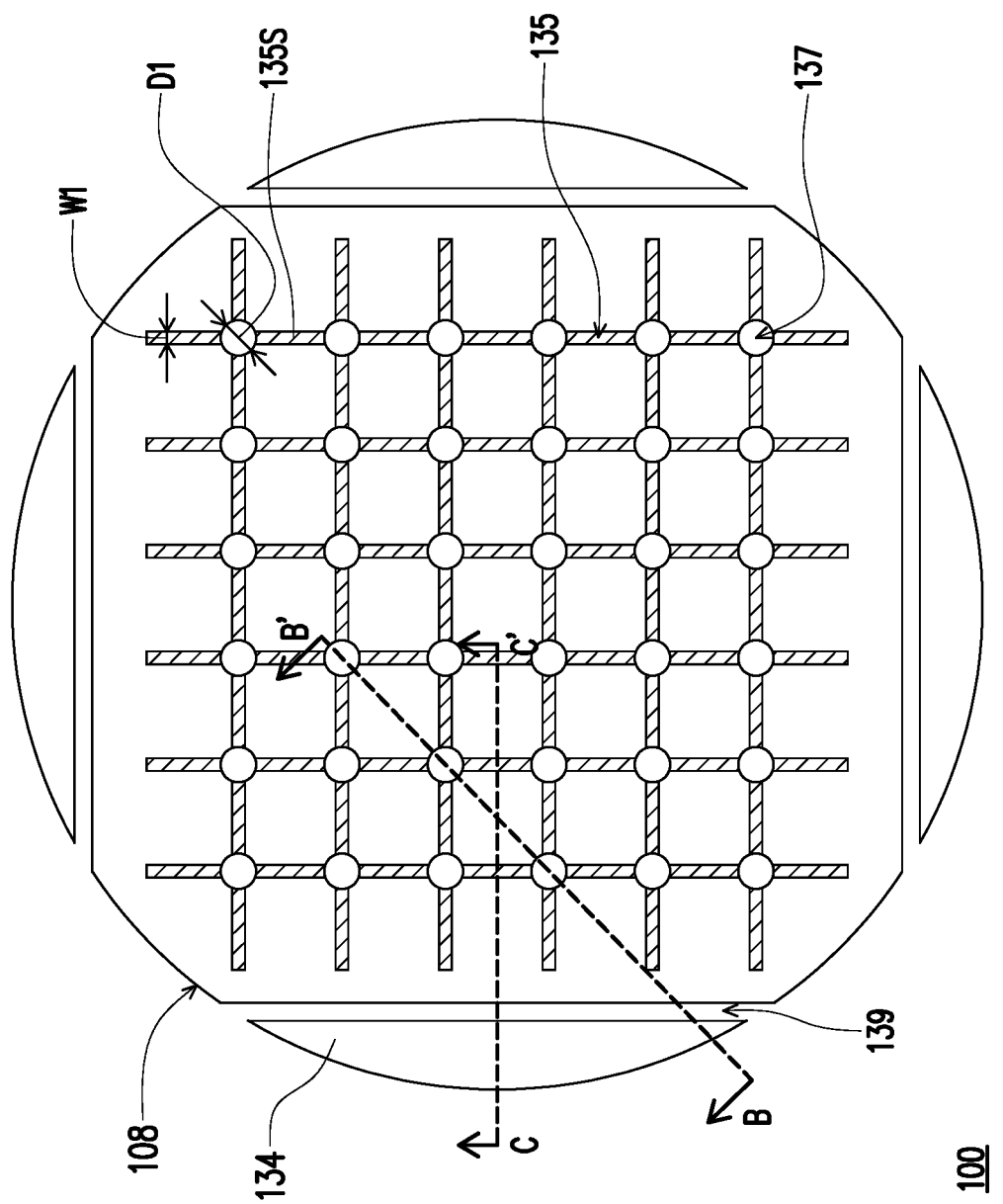
Figure 8B:
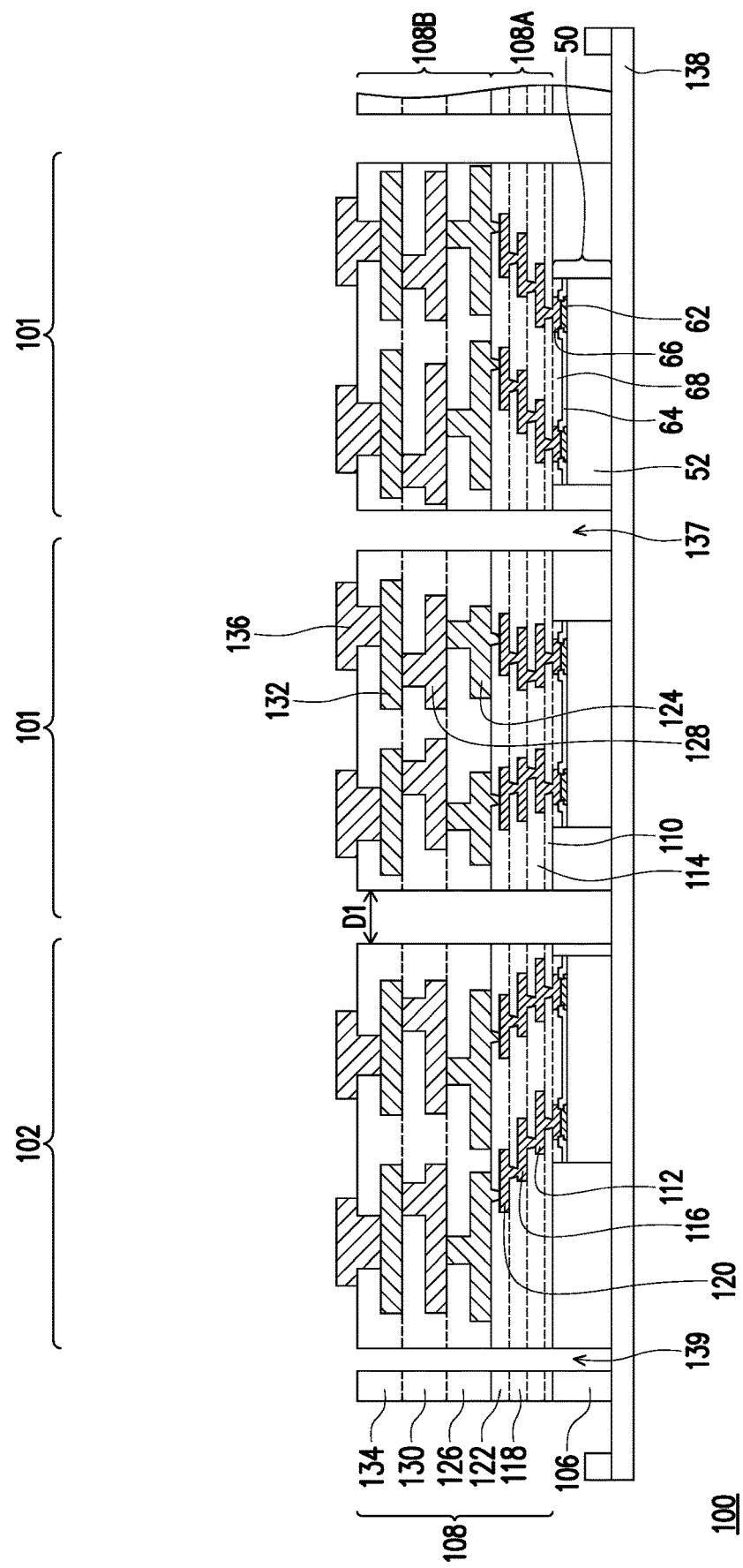
Figure 8C:
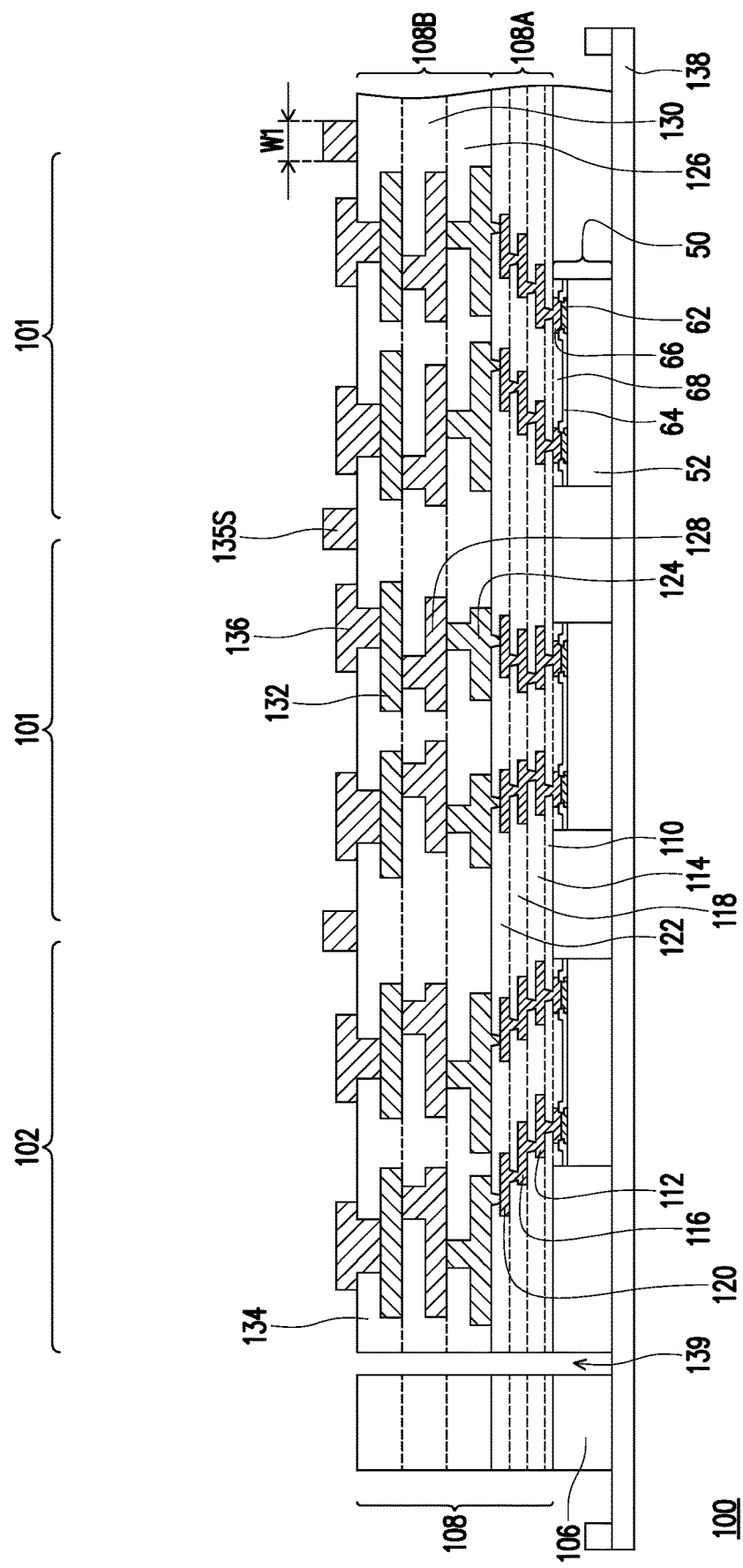

In FIGS. 8A through 8C, openings 137 and trenches 139 are formed through the redistribution structure 108 and the encapsulant 106. The openings 137 may be circular bolt holes, which may be used to secure additional features above and below the package component 100. The openings 137 may be formed by a drilling process such as laser drilling, mechanical drilling, or the like. As shown in FIGS. 8A and 8B, the openings 137 are formed through the metal lines 135, at the intersections of horizontal and vertical metal lines 135. The openings 137 may have a diameter D1 in a range from 3.9 mm to 4.8 mm, such as 4.3 mm. In some embodiments, the diameter D1 of the openings 137 is larger than the width W1 of the metal lines 135, which results in the removal of the corresponding intersections of horizontal and vertical metal lines 135, thereby separating the metal lines 135 into metal line segments 135S.

The trenches 139 may be formed to truncate the wings of package component 100. Accordingly, the package component 100 may have a truncated circular shape. Use of a truncated circular shape may help reduce the total space occupied by the package component 100, thereby increasing the amount of integrated circuit package that may be included in an external system. The trenches 139 may be formed by a sawing process, or the like. In other embodiments, the trenches 139 are not formed, in which case the package component 100 may have an untruncated circular shape.

Figure 9A:
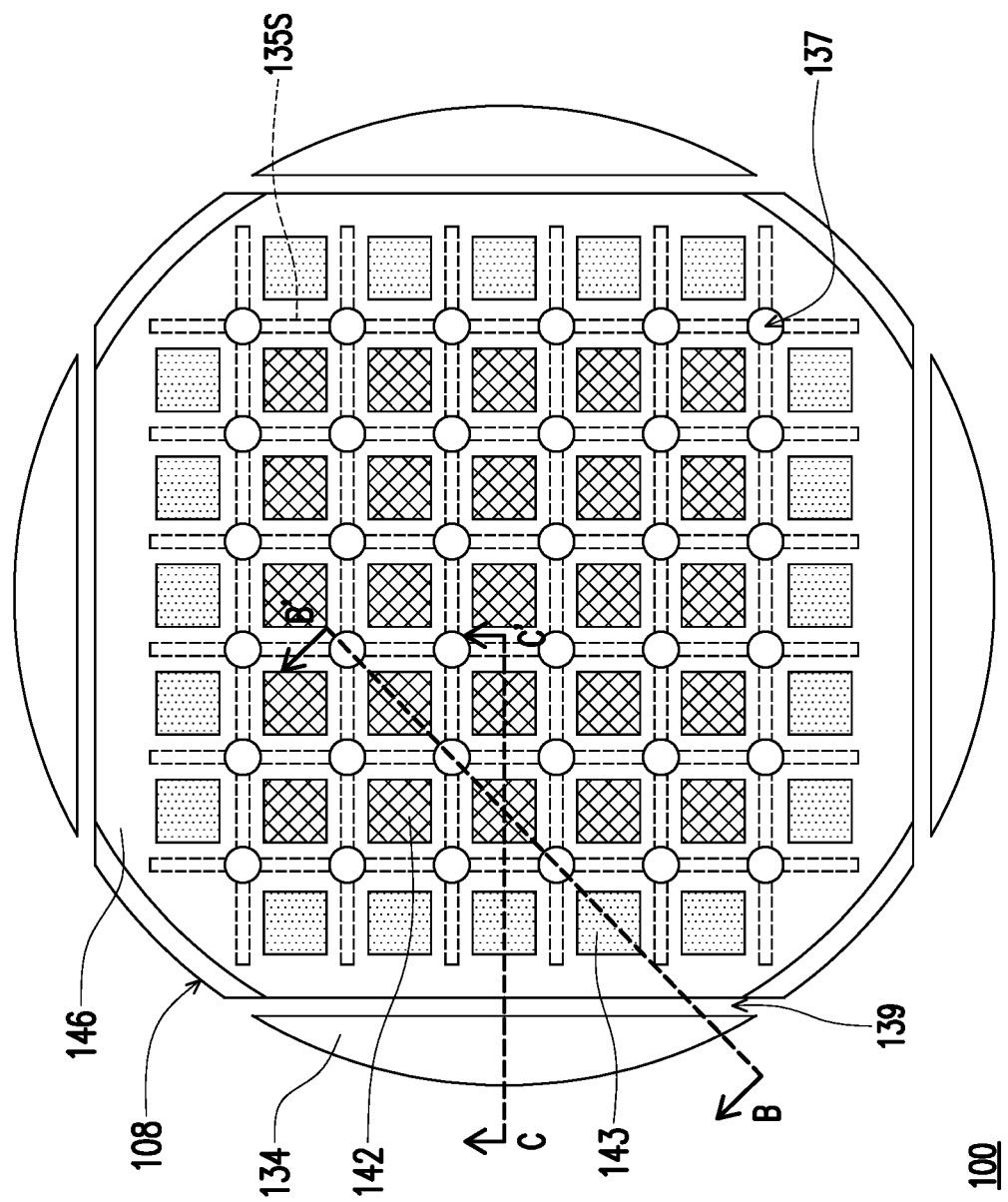
Figure 9B:
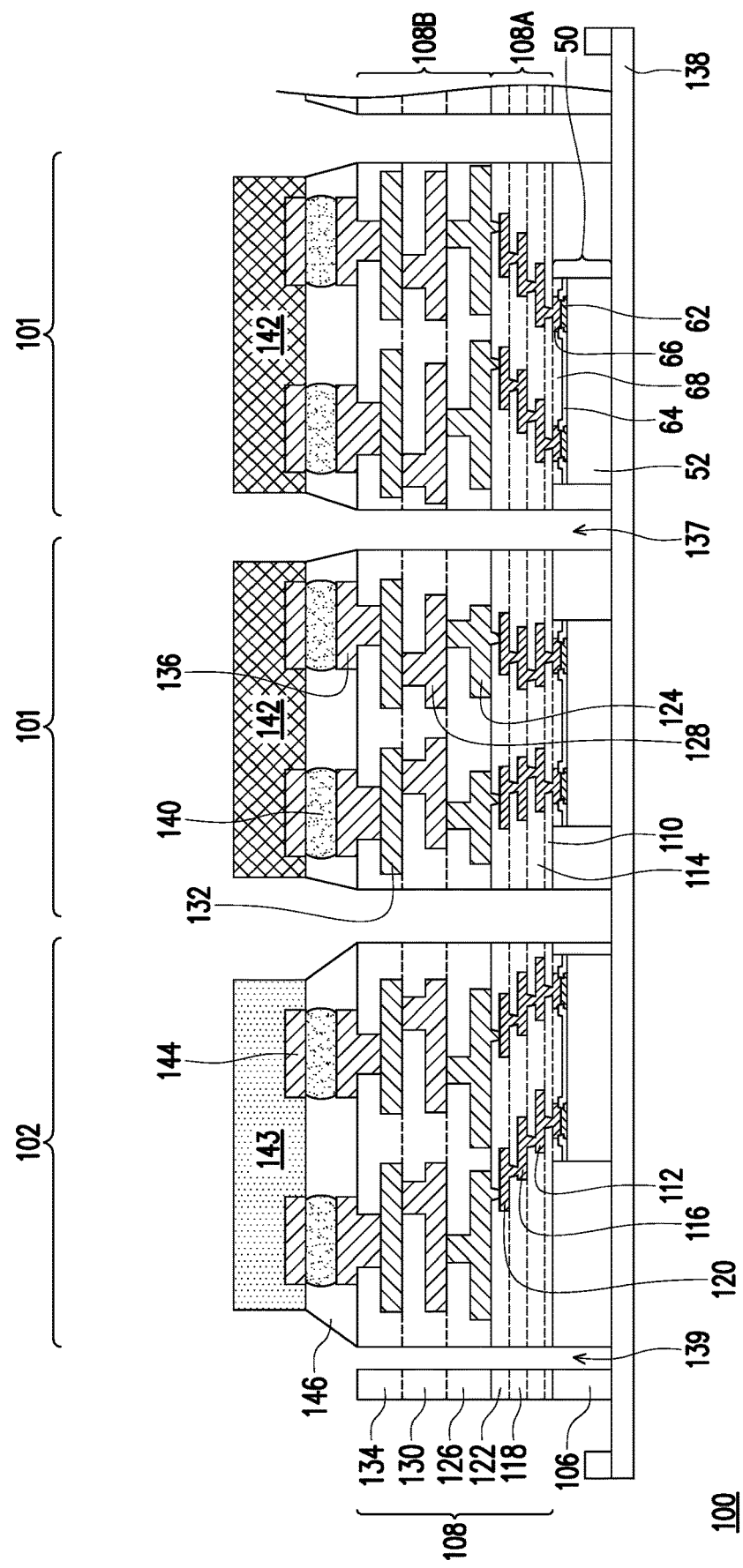
Figure 9C:
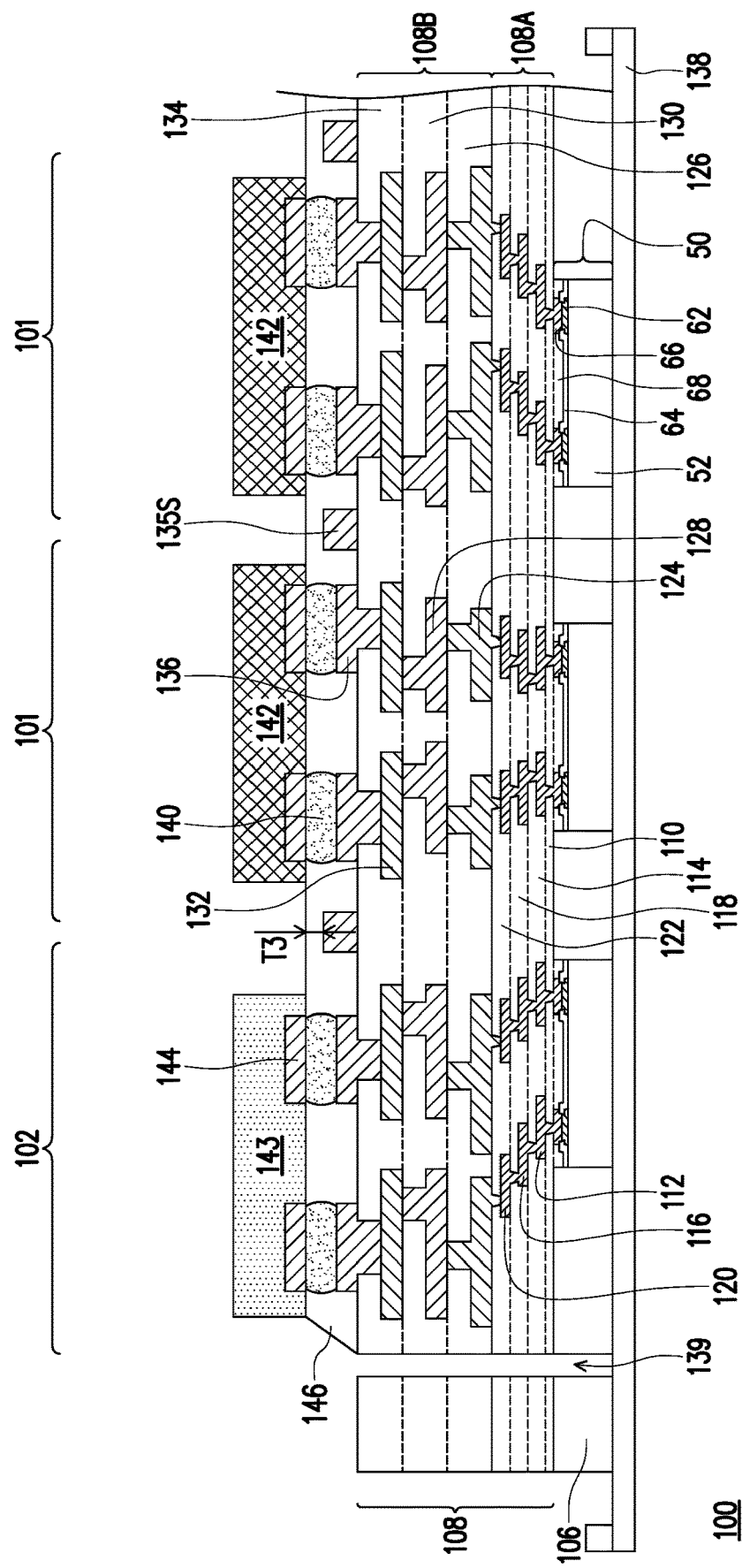

In FIGS. 9A through 9C, conductive connectors 140 are formed on the UBMs 136, electrical components such as modules 142 and connectors 143 are attached to the redistribution structure 108, and an underfill 146 is formed to fill the gaps between the modules 142 and connectors 143 and the redistribution structure 108. The metal line segments 135S are shown in ghost in FIG. 9A for illustrative purposes.

Conductive connectors 140 are formed on the UBMs 136. The conductive connectors 140 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 140 may include a conductive material such as solder, copper, aluminum, gold, nickel, silver, palladium, tin, the like, or a combination thereof. In some embodiments, the conductive connectors 140 may be formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Modules 142 and connectors 143 are attached to the redistribution structure 108. The modules 142 and the connectors 143 include pads 144, such as aluminum pads, to which external connections are made. The modules 142 and the connectors 143 are mounted to the UBMs 136 using the conductive connectors 140. In some embodiments, the modules 142 may be attached at the computing sites 101, and the connectors 143 may be attached at the connecting site 102.

The modules 142 may include memory modules, voltage regulator modules (VRM), power supply modules, integrated passive device (IPD) modules, or the like. The type of modules selected depends on the type of functional systems desired at the computing sites 101. The modules 142 are shown as having a rectangular shape in the top-down view as an example. The modules 142 may have other shapes in the top-down view.

The connectors 143 may be electrical and physical interfaces for the package component 100 to external systems. When the package component 100 is installed as part of a larger external system, such as a data center, the connectors 143 may be used to couple the package component 100 to the external system. Examples of connectors 143 include receptors for ribbon cables, flexible printed circuits, and the like.

The modules 142 and the connectors 143 may be attached to the redistribution structure 108 in a variety of layouts. FIG. 9A shows an example of a layout. The modules 142 may form an array comprising columns and rows in a center region of the package component 100. An opening 137 may be disposed adjacent each corner of the modules 142. The metal line segments 135S may be disposed between neighboring columns and neighboring rows of the modules 142. The metal line segments 135S may extend around each module 142. The connectors 143 may form two columns and two rows, and may be disposed around the perimeter of the package component 100, thus encircling the array of the modules 142. An opening 137 may be disposed adjacent each corner of the connectors 143 facing the array of the modules 142. The metal line segments 135S may be disposed between each column of the connectors 143 and the respective neighboring column of the modules 142 as well as between each row of the connectors 143 and the respective neighboring row of the modules 142. The metal line segments 135S may be disposed between neighboring connectors 143.

An underfill 146 is formed to fill the gaps between the modules 142 and the connectors 143 and the redistribution structure 108 to reduce stress and protect the conductive connectors 140. The underfill 146 may include a base material, such as an epoxy, and filler particles in the epoxy. In some embodiments, the underfill 146 may be formed by a suitable deposition method before the modules 142 and connectors 143 are attached. In some embodiments, the underfill 146 may be formed by a capillary flow process after the modules 142 and connectors 143 are attached. The underfill 146 may be subsequently cured. FIGS. 9B and 9C show the underfill 146 being free of contact with sidewalls of the modules 142 and connectors 143 as an example. In some embodiments, the underfill 146 may extend along the sidewalls of the modules 142 and connectors 143. As shown in FIG. 9B, the openings 137 as well as the space between the modules 142 and connectors 143 above the openings 137 are free of the underfill 146. The openings 137 and the space between the modules 142 and connectors 143 above the openings 137 may be kept free of the underfill 146 during dispensing of the underfill 146 by controlling the dispensing path of the underfill 146. As shown in FIG. 9C, the metal line segments 135S are completely covered by the underfill 146, which may extend between a conductive connector 140 underneath a module 142 to a neighboring conductive connector 140 underneath a neighboring connector 143, as well as between the conductive connector 140 underneath the module 142 to a neighboring conductive connector 140 underneath a neighboring module 142. In other words, the underfill 146 is initially formed as a continuous layer of underfill material on the redistribution structure 108. The portions of the underfill 146 disposed on the metal line segment 135S may have a thickness T3 in a range from 1.1 mm to 1.3 mm, such as 1.2 mm.

FIGS. 8A through 9C illustrate forming the openings 137 and the trenches 139 before forming the underfill 146 as an example. The openings 137 and the trenches 139 may be formed after forming the underfill 146.

Figure 10A:
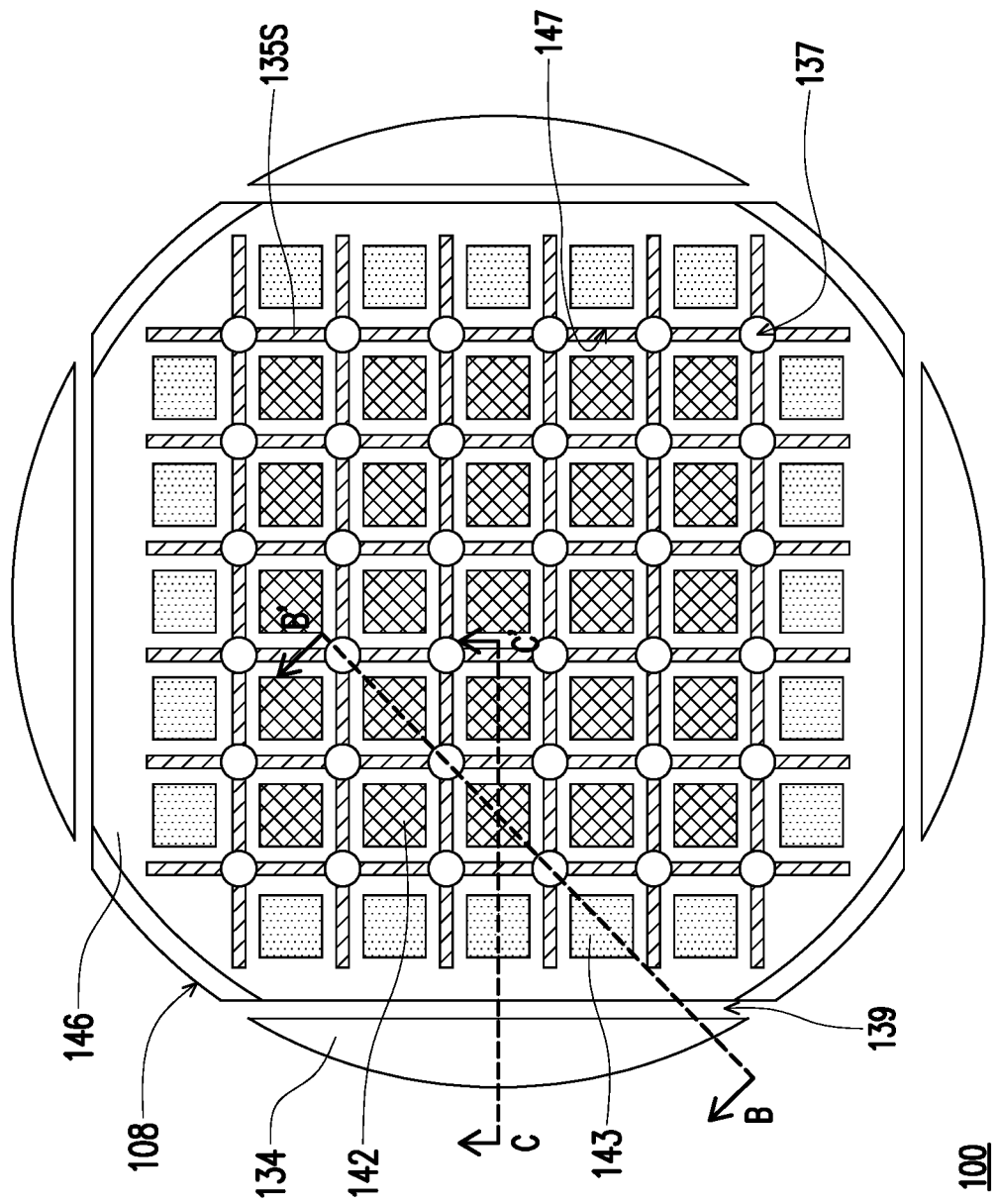
Figure 10B:
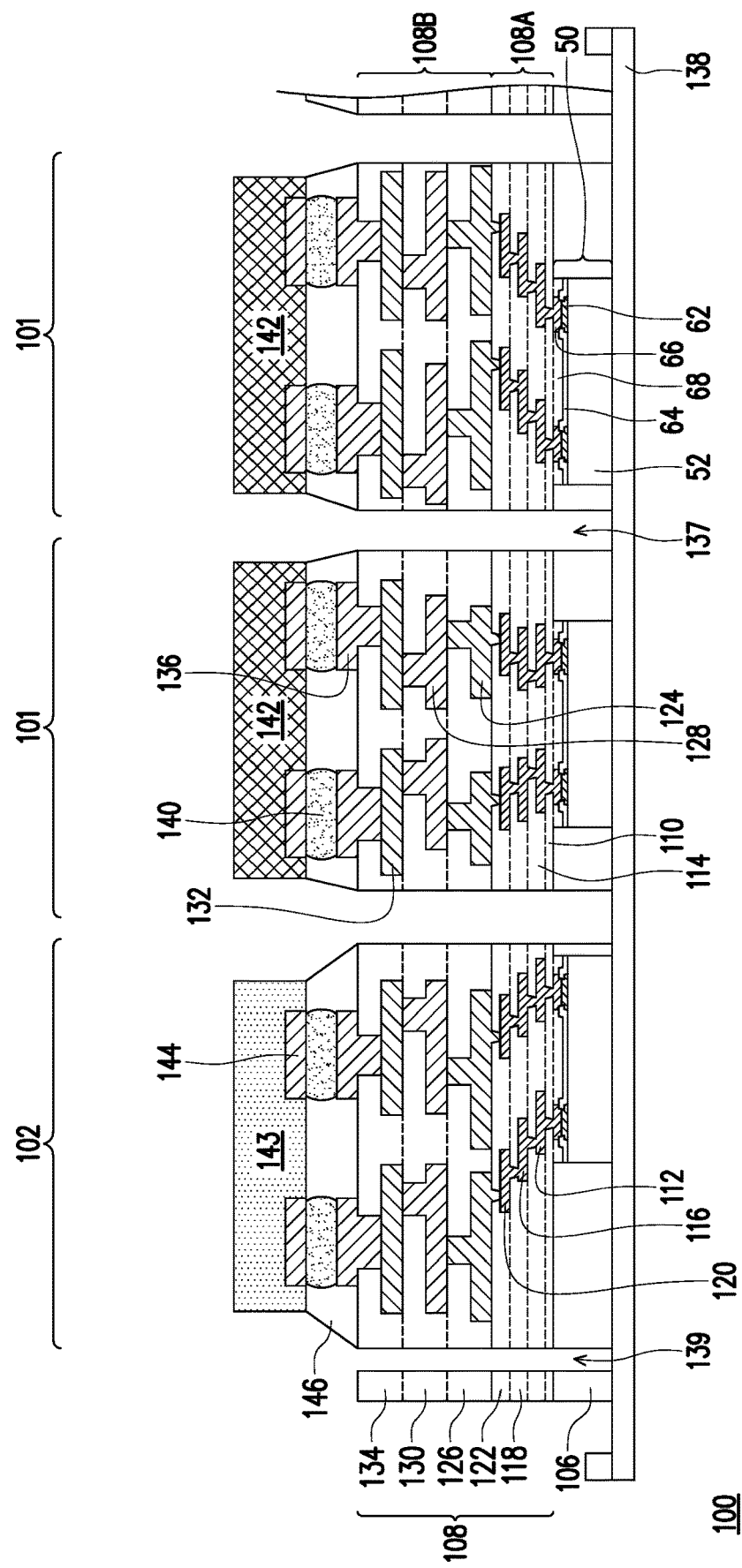
Figure 10C:
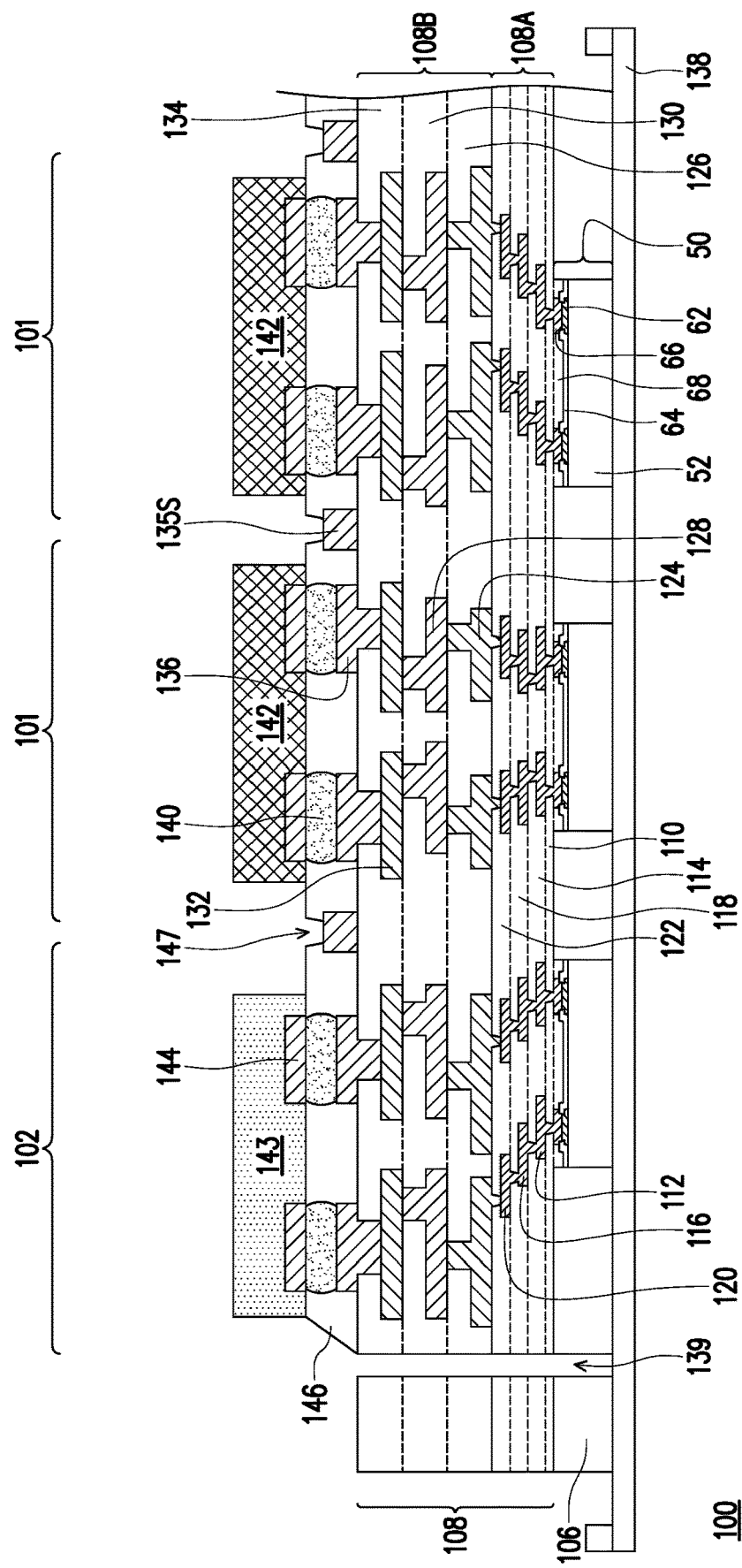

In FIGS. 10A through 10C, openings 147 are formed to expose portions of the metal line segments 135S. The exposed portions of the metal line segments 135S are free of contact with the underfill 146 after the openings 147 are formed. The openings 147 may release the stress in the underfill 146 caused by the warpage of the package component 100 during manufacturing or operation, thereby reducing the risk of the cracking of the underfill 146. The reliability of the resulting integrated circuit package may thus be improved. The openings 147 may be disposed between neighboring columns and neighboring rows of the modules 142. The openings 147 may extend around each module 142. The openings 147 may be disposed between each column of the connectors 143 and the respective neighboring column of the modules 142 as well as between each row of the connectors 143 and the respective neighboring row of the modules 142. The openings 147 may be disposed between neighboring connectors 143.

The openings 147 may be formed by a laser sawing process. The openings 147 may be formed by sequentially creating each opening 147 over a respective metal line segment 135S. The openings 147 may be strips extending along the first (e.g., horizontal) direction and the second (e.g., vertical) direction, as shown in FIG. 10A. As an example of the laser sawing process, a laser beam may be directed at a desired region of the underfill 146. In some embodiments, a femtosecond laser with a wavelength at 517 nm and a power of 10 W may be used, and the opening 147 may be created by moving the laser beam from over one end of a metal line segment 135S to over the other end of the metal line segment 135S for four times, which corresponds to four sawing passes, thereby removing the underfill 146 from over the metal line segment 135S. As a result, a portion of a top surface of the metal line segment 135S is exposed. The laser sawing process removes the material of the underfill 146 at a faster rate than the material of the metal line segments 135S. In some embodiments, a portion of the metal line segment 135S may be thinned during the laser sawing process, but the opening 147 does not extend through the metal line segment 135S. As a result, the openings 147 and the redistribution structure 108 remain separated by the metal line segment 135S after the laser sawing process. Since the removal rate of the metal line segment 135S is less than the removal rate of the underfill 146 during the laser sawing, the metal line segment 135S acts as a stop layer during the laser sawing process, which may reduce the risk of damaging the underlying redistribution structure 108 by the laser beam. A different combination of laser power and sawing passes may result in an undercut profile, wherein the metal line segment 135S may not be exposed, or may result in an overcut profile, wherein the metal line segment 135S may be sawn through. An undercut profile may lead to insufficient stress release in the underfill 146 and an overcut profile may lead to damage to the underlying redistribution structure 108. The previously described process may then be repeated for each metal line segment 135S, thereby exposing all of the metal line segments 135S.

Figure 10D:
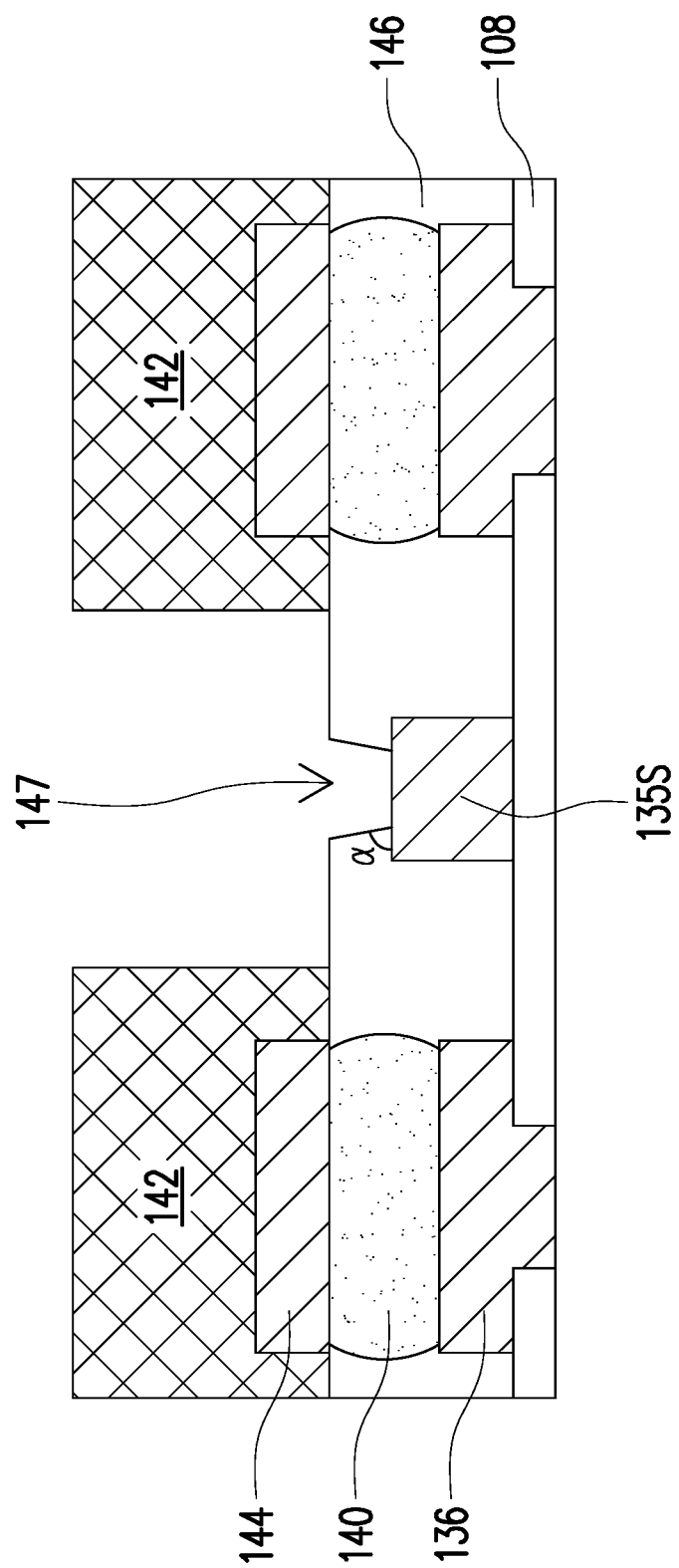

FIG. 10D shows a portion of the structure shown in FIG. 10C. The top surface of the metal line segment 135S may be exposed while the remaining portion of the top surface and sidewalls of the metal line segment 135S may still be completely covered by the underfill 146. Sidewalls of the underfill 146, exposed by the opening 147 may be substantially smooth and continuous, and free of cracks. An acute angle α between the top surface of the metal line segment 135S and the sidewall of the underfill 146 may be larger than 80°. Other types of sawing techniques may result in sidewalls of the underfill 146 being rough and having cracks, and the acute angle α being smaller than 80°.

Figure 11A:
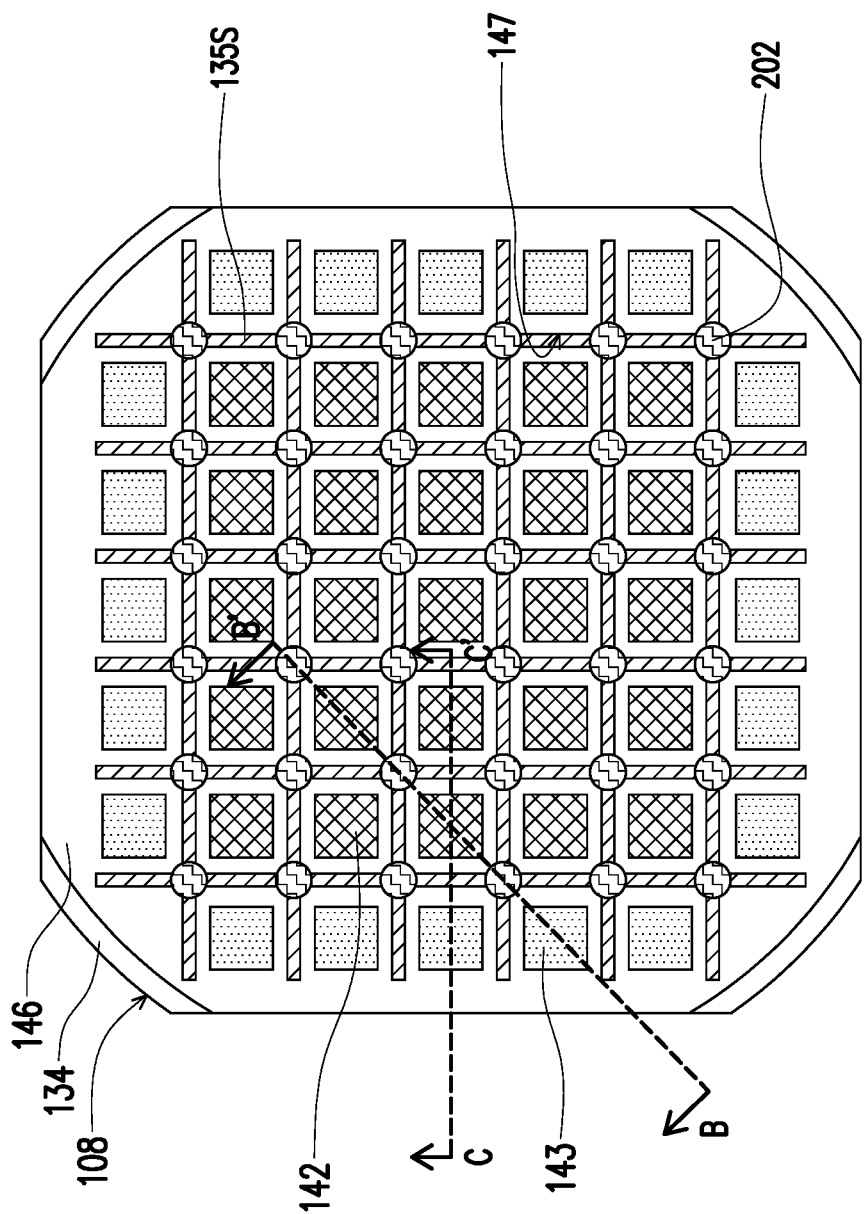
Figure 11B:
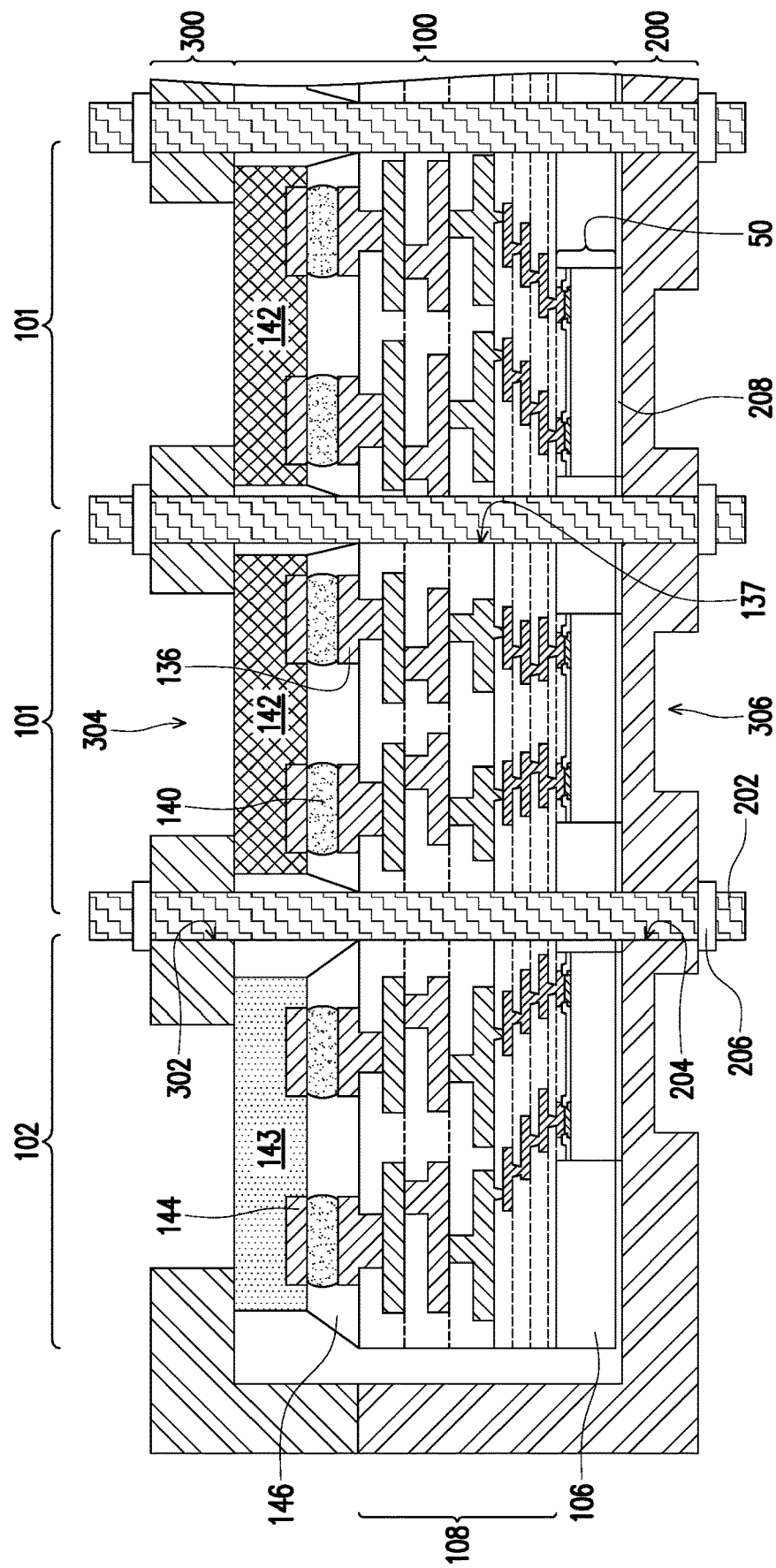
Figure 11C:
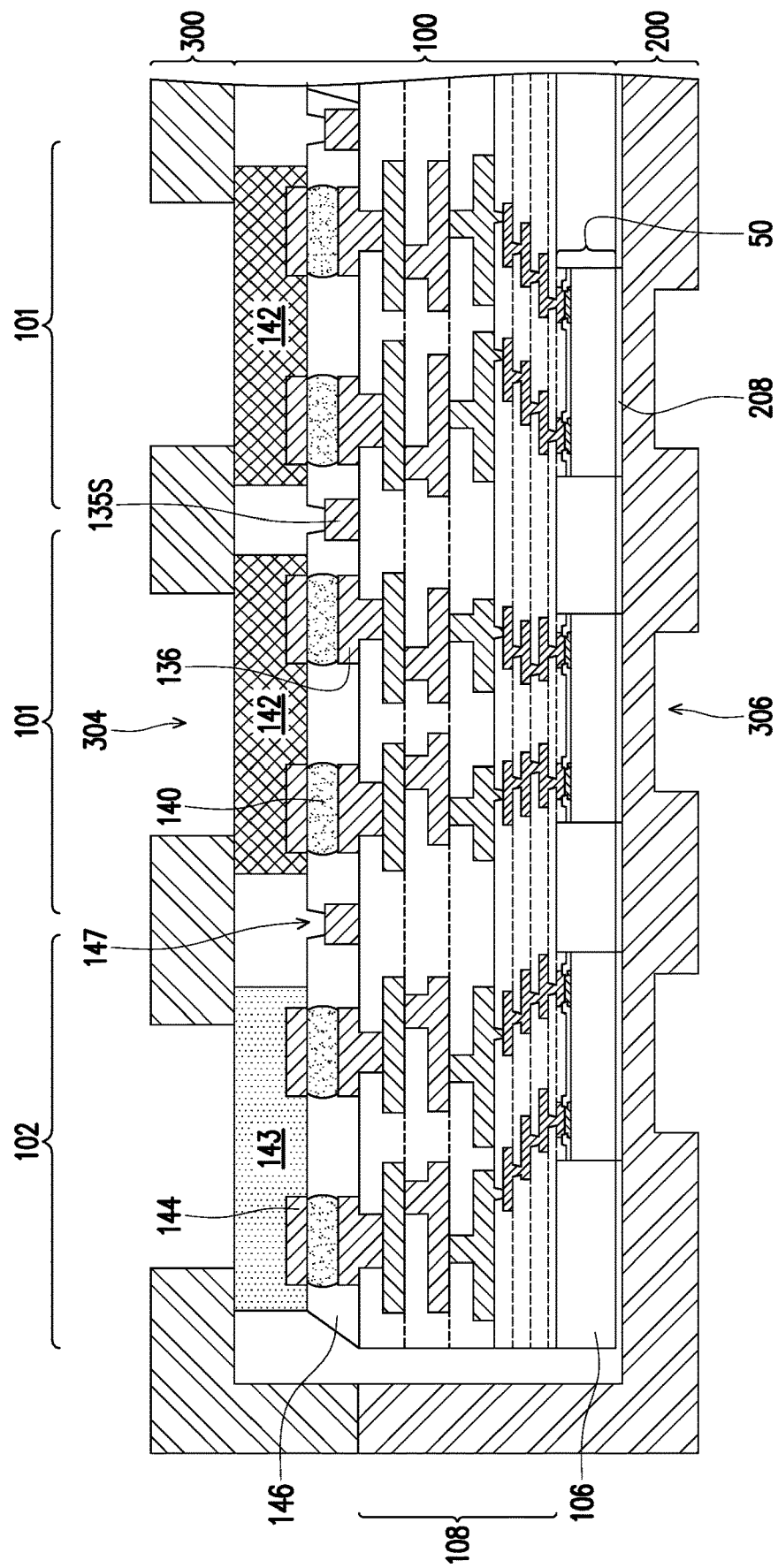

In FIGS. 11A through 11C, the package component 100 is secured between a thermal module 200 and a mechanical brace 300 by bolts 202. The thermal module 200 and the mechanical brace 300 are omitted from FIG. 11A for illustrative purposes. The thermal module 200 may be a heat sink, a heat spreader, a cold plate, or the like. The thermal module 200 may have recesses 306 that may accommodate cooling fluid during operation. A thermal interface material (TIM) 208 may be disposed between the integrated circuit dies 50 and the thermal module 200, which may physically and thermally couple the thermal module 200 to the integrated circuit dies 50. The mechanical brace 300 may be a rigid support that physically contacts and secures the modules 142 and the connectors 143. The mechanical brace 300 may have openings 304 that may provide external access to the modules 142 and the connectors 143. Additional electronic components may be installed in the modules 142 (through the openings 304) during integration of the package component 100 in a computing system.

As shown in FIG. 11B, the package component 100 may be removed from the tape 138 (shown in FIG. 10B) and may be fastened between the thermal module 200 and the mechanical brace 300 with bolts 202. The bolts 202 may extend through openings 137 of the package component 100, corresponding bolt holes 204 in the thermal module 200, and corresponding bolt holes 302 in the mechanical brace 300. Fasteners 206, such as nuts, may be threaded onto the bolts 202 and tightened to clamp the package component 100 between the thermal module 200 and the mechanical brace 300. The thermal module 200 and the mechanical brace 300 are thus at respective sides of the resulting integrated circuit package. The side having the thermal module 200 may be referred to as the back side and the side having the mechanical brace 300 may be referred to as the front side. As shown in FIG. 11C, the mechanical brace 300 may extend directly over the exposed top surfaces of the metal line segments 135S.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. The metal line segments 135S, which may be electrically floating, may act as saw stop layers during laser sawing of the underfill 146 to form the openings 147, thereby reducing the risk of causing damage to the redistribution structure 108 by the laser beam used in the laser sawing process. The openings 147 may release the stress in the underfill 146 caused by the warpage of the package component 100 during manufacturing or operation, thereby reducing the risk of the cracking of the underfill 146. As a result, the reliability of the resulting integrated circuit package may be improved.

In an embodiment, a device includes integrated circuit dies; an encapsulant around the integrated circuit dies; a redistribution structure on the encapsulant, the redistribution structure comprising redistribution lines and a first metal pad, the redistribution lines and the first metal pad connected to the integrated circuit dies; a first metal line disposed on the redistribution structure, wherein the first metal line is electrically floating; a first electrical component connected to the first metal pad; and an underfill between the first electrical component and the redistribution structure, wherein the underfill is around the first metal pad, and wherein a first opening in the underfill exposes a top surface of the first metal line. In an embodiment, a thickness of the first metal line is larger than a thickness of the first metal pad. In an embodiment, an acute angle between the top surface of the first metal line and a sidewall of the underfill exposed by the opening in the underfill is larger than 80°. In an embodiment, the underfill covers a portion of the top surface of the first metal line. In an embodiment, the underfill completely covers sidewalls of the first metal line.

In an embodiment, the redistribution structure further includes a second metal pad adjacent the first metal pad, the device further includes a second electrical component connected to the second metal pad, wherein the first metal line is disposed between the first metal pad and the second metal pad. In an embodiment, the redistribution structure further includes a third metal pad adjacent the second metal pad, the device further includes a third electrical component connected to the third metal pad; and a second metal line between the second metal pad and the third metal pad, wherein the second metal line is electrically floating, and wherein the second metal line is parallel to the first metal line in a top-down view. In an embodiment, the redistribution structure further includes a third metal pad adjacent the second metal pad, the device further includes a third electrical component connected to the third metal pad; and a second metal line between the second metal pad and the third metal pad, wherein the second metal line is electrically floating, and wherein the second metal line is perpendicular to the first metal line in a top-down view.

In an embodiment, a device includes integrated circuit dies; a redistribution structure over the integrated circuit dies, the redistribution structure comprising redistribution lines, a first metal pad, and a second metal pad, wherein the redistribution lines, the first metal pad, and the second metal pad are electrically coupled to the integrated circuit dies; a first metal line disposed on the redistribution structure and between the first metal pad and the second metal pad; a first electrical component connected to the first metal pad; a second electrical component connected to the second metal pad; and an underfill, wherein the underfill is between the first electrical component and the redistribution structure, wherein the underfill is between the second electrical component and the redistribution structure, wherein the underfill extends on sidewalls and a top surface of the first metal line, and wherein a portion of the first metal line is free of contact with the underfill. In an embodiment, the first metal line is electrically isolated from the redistribution lines, the first metal pad, the second metal pad, and the integrated circuit dies. In an embodiment, an acute angle between the top surface of the first metal line and a sidewall of the underfill is larger than 80°. In an embodiment, the top surface of the first metal line is spaced apart from a top surface of the redistribution structure by a first distance, wherein a top surface of the first metal pad is spaced apart from the top surface of the redistribution structure by a second distance, and wherein the first distance is larger than the second distance. In an embodiment, the first electrical component is a voltage regulator module and the second electrical component is a connector.

In an embodiment, a method includes forming a package component including integrated circuit dies, an encapsulant around the integrated circuit dies, and a redistribution structure over the encapsulant, wherein the redistribution structure includes a first metal pad connected to the integrated circuit dies, and wherein the first metal pad has a first thickness; forming a first metal line on the redistribution structure, wherein the first metal line is electrically floating, and wherein the first metal line has a second thickness larger than the first thickness; bonding a first electrical component to the first metal pad; forming an underfill between the first electrical component and the redistribution structure, wherein the underfill completely covers the first metal line; and sawing a first opening in the underfill and over the first metal line by a laser beam, the laser beam removing the underfill at a faster rate than the first metal line. In an embodiment, the first metal line is partially exposed by the first opening after the sawing of the first opening. In an embodiment, the first opening and the redistribution structure remain separated by the first metal line after the sawing of the first opening. In an embodiment, sawing the first opening in the underfill forms a first sidewall of the underfill, and wherein an acute angle between a top surface of the first metal line and the first sidewall of the underfill is larger than 80°. In an embodiment, the first sidewall of the underfill is free from cracks. In an embodiment, the first metal pad and the first metal line are formed by a same plating process. In an embodiment, the method further includes drilling a second opening through the first metal line, the redistribution structure, and the encapsulant; and assembling the package component between a thermal module and a mechanical brace with a bolt extending through the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    integrated circuit dies;
    an encapsulant around the integrated circuit dies;
    a redistribution structure on the encapsulant, the redistribution structure comprising redistribution lines and a first metal pad, the redistribution lines and the first metal pad connected to the integrated circuit dies;
    a first metal line disposed on the redistribution structure, wherein the first metal line is electrically floating;
    a first electrical component connected to the first metal pad; and
    an underfill between the first electrical component and the redistribution structure, wherein the underfill is around the first metal pad, and wherein a first opening in the underfill exposes a top surface of the first metal line.

2. The device of claim 1, wherein a thickness of the first metal line is larger than a thickness of the first metal pad.

3. The device of claim 1, wherein an acute angle between the top surface of the first metal line and a sidewall of the underfill exposed by the first opening in the underfill is larger than 80°.

4. The device of claim 1, wherein the underfill covers a portion of the top surface of the first metal line.

5. The device of claim 1, wherein the underfill completely covers sidewalls of the first metal line.

6. The device of claim 1, wherein the redistribution structure further comprises a second metal pad adjacent the first metal pad, the device further comprising:
    a second electrical component connected to the second metal pad, wherein the first metal line is disposed between the first metal pad and the second metal pad.

7. The device of claim 6, wherein the redistribution structure further comprises a third metal pad adjacent the second metal pad, the device further comprising:
    a third electrical component connected to the third metal pad; and a second metal line between the second metal pad and the third metal pad, wherein the second metal line is electrically floating, and wherein the second metal line is parallel to the first metal line in a top-down view.

8. The device of claim 6, wherein the redistribution structure further comprises a third metal pad adjacent the second metal pad, the device further comprising:
a third electrical component connected to the third metal pad; and
a second metal line between the second metal pad and the third metal pad, wherein the second metal line is electrically floating, and wherein the second metal line is perpendicular to the first metal line in a top-down view.

9. A device comprising:
integrated circuit dies;
a redistribution structure over the integrated circuit dies, the redistribution structure comprising redistribution lines, a first metal pad, and a second metal pad, wherein the redistribution lines, the first metal pad, and the second metal pad are electrically coupled to the integrated circuit dies;
a first metal line disposed on the redistribution structure and between the first metal pad and the second metal pad;
a first electrical component connected to the first metal pad;
a second electrical component connected to the second metal pad; and
an underfill, wherein the underfill is between the first electrical component and the redistribution structure, wherein the underfill is between the second electrical component and the redistribution structure, wherein the underfill extends on sidewalls and a top surface of the first metal line, and wherein a portion of the first metal line is free of contact with the underfill.

10. The device of claim 9, wherein the first metal line is electrically isolated from the redistribution lines, the first metal pad, the second metal pad, and the integrated circuit dies.

11. The device of claim 9, wherein an acute angle between the top surface of the first metal line and a sidewall of the underfill is larger than 80°.

12. The device of claim 9, wherein the top surface of the first metal line is spaced apart from a top surface of the redistribution structure by a first distance, wherein a top surface of the first metal pad is spaced apart from the top surface of the redistribution structure by a second distance, and wherein the first distance is larger than the second distance.

13. The device of claim 9, wherein the first electrical component is a voltage regulator module and the second electrical component is a connector.

14. A method comprising:
forming a package component comprising integrated circuit dies, an encapsulant around the integrated circuit dies, and a redistribution structure over the encapsulant, wherein the redistribution structure comprises a first metal pad connected to the integrated circuit dies, and wherein the first metal pad has a first thickness;
forming a first metal line on the redistribution structure, wherein the first metal line is electrically floating, and wherein the first metal line has a second thickness larger than the first thickness;
bonding a first electrical component to the first metal pad;
forming an underfill between the first electrical component and the redistribution structure, wherein the underfill completely covers the first metal line; and
sawing a first opening in the underfill and over the first metal line by a laser beam, the laser beam removing the underfill at a faster rate than the first metal line.

15. The method of claim 14, wherein the first metal line is partially exposed by the first opening after the sawing of the first opening.

16. The method of claim 15, wherein the first opening and the redistribution structure remain separated by the first metal line after the sawing of the first opening.

17. The method of claim 14, wherein sawing the first opening in the underfill forms a first sidewall of the underfill, and wherein an acute angle between a top surface of the first metal line and the first sidewall of the underfill is larger than 80°.

18. The method of claim 17, wherein the first sidewall of the underfill is free from cracks.

19. The method of claim 14, wherein the first metal pad and the first metal line are formed by a same plating process.

20. The method of claim 14 further comprising:
drilling a second opening through the first metal line, the redistribution structure, and the encapsulant; and
assembling the package component between a thermal module and a mechanical brace with a bolt extending through the second opening.

* * * * *